(12) United States Patent
Victor et al.

(10) Patent No.: US 10,656,330 B2
(45) Date of Patent: May 19, 2020

(54) USE OF VARIABLE BEAM PARAMETERS TO CONTROL SOLIDIFICATION OF A MATERIAL

(71) Applicant: nLIGHT, Inc., Vancouver, WA (US)

(72) Inventors: Brian Victor, Camas, WA (US);
Robert Martinsen, Portland, OR (US);
Lynn Sheehan, Vancouver, WA (US);
Dahv A. V. Kliner, Portland, OR (US);
Roger Farrow, Vancouver, WA (US)

(73) Assignee: NLIGHT, INC., Vancouver, WA (US)

(*) Notice: Subject to any disclaimer, the term of this patent is extended or adjusted under 35 U.S.C. 154(b) by 0 days.

(21) Appl. No.: 15/885,563

(22) Filed: Jan. 31, 2018

(65) Prior Publication Data

US 2018/0180803 A1 Jun. 28, 2018
US 2020/0116926 A9 Apr. 16, 2020

Related U.S. Application Data

(63) Continuation-in-part of application No. 15/607,410, filed on May 26, 2017, and a continuation-in-part of
(Continued)

(51) Int. Cl.
*G02B 6/036* (2006.01)
*G02B 6/02* (2006.01)
(Continued)

(52) U.S. Cl.
CPC ........ *G02B 6/03611* (2013.01); *B23K 26/032* (2013.01); *B23K 26/034* (2013.01);
(Continued)

(58) Field of Classification Search
CPC .................................................. G02B 6/03611
See application file for complete search history.

(56) References Cited

U.S. PATENT DOCUMENTS 4,252,403 A * 2/1981 Salisbury ............... G02B 6/262
385/124
4,266,851 A * 5/1981 Salisbury ............ G02B 6/2551
250/227.24
(Continued)

FOREIGN PATENT DOCUMENTS

BY 12235 8/2009
CN 1584644 2/2005
(Continued)

OTHER PUBLICATIONS

Bergmann et al., Effects of diode laser superposition on pulsed laser welding of Aluminum, Lasers in Manufacturing Conference 2013, Physics Procedia 41 ( 2013 ) 180-189 (Year: 2013).*
(Continued)

*Primary Examiner* — Peter Radkwoski
(74) *Attorney, Agent, or Firm* — Schwabe Williamson & Wyatt, P.C.

(57) ABSTRACT

A method for forming an article includes providing a material having a first material property; forming a melt pool by exposing the material to an optical beam having at least one beam characteristic, wherein the melt pool has at least one melt pool property determinative of a second material property of the material; and modifying the at least one beam characteristic in response to a change in the melt pool property.

26 Claims, 21 Drawing Sheets

Related U.S. Application Data application No. PCT/US2017/034848, filed on May 26, 2017, and a continuation-in-part of application No. 15/607,411, filed on May 26, 2017, now Pat. No. 10,295,845, and a continuation-in-part of application No. 15/607,399, filed on May 26, 2017, now Pat. No. 10,423,015.

(60) Provisional application No. 62/401,650, filed on Sep. 29, 2016.

(51) Int. Cl.

| | | |
|---|---|---|
| *G02B 6/42* | (2006.01) | |
| *B29C 48/08* | (2019.01) | |
| *B23K 26/21* | (2014.01) | |
| *B23K 26/03* | (2006.01) | |
| *G02B 6/26* | (2006.01) | |
| *B23K 26/342* | (2014.01) | |
| *G02B 6/028* | (2006.01) | |

(52) U.S. Cl.
CPC .......... *B23K 26/0342* (2015.10); *B23K 26/21* (2015.10); *B23K 26/342* (2015.10); *B29C 48/08* (2019.02); *G02B 6/021* (2013.01); *G02B 6/02347* (2013.01); *G02B 6/02371* (2013.01); *G02B 6/02395* (2013.01); *G02B 6/262* (2013.01); *G02B 6/4203* (2013.01); *G02B 6/0288* (2013.01); *G02B 6/03616* (2013.01)

(56) References Cited

U.S. PATENT DOCUMENTS

| | | | | |
|---|---|---|---|---|
| 4,475,027 | A * | 10/1984 | Pressley | B23K 26/0732 219/121.6 |
| 5,082,349 | A | 1/1992 | Cordova-Plaza et al. | |
| 5,153,773 | A * | 10/1992 | Muraki | G02B 3/0056 359/211.1 |
| 5,475,415 | A * | 12/1995 | Noethen | B41J 2/45 347/238 |
| 5,642,198 | A | 6/1997 | Long | |
| 5,719,386 | A | 2/1998 | Hsieh et al. | |
| 5,841,465 | A | 11/1998 | Fukunaga et al. | |
| 5,864,430 | A * | 1/1999 | Dickey | B23K 26/073 219/121.69 |
| 5,986,807 | A * | 11/1999 | Fork | G02B 5/1876 359/566 |
| 6,275,630 | B1 | 8/2001 | Yang et al. | |
| 6,310,995 | B1 | 10/2001 | Saini et al. | |
| 6,417,963 | B1 | 7/2002 | Ohishi et al. | |
| 6,433,301 | B1 * | 8/2002 | Dunsky | B23K 26/073 219/121.67 |
| 6,483,973 | B1 * | 11/2002 | Mazzarese | H01S 3/06708 372/6 |
| 6,496,301 | B1 * | 12/2002 | Koplow | G02B 6/14 359/337 |
| 6,569,382 | B1 | 5/2003 | Edman et al. | |
| 6,639,177 | B2 * | 10/2003 | Ehrmann | B23K 26/032 219/121.68 |
| 6,779,364 | B2 * | 8/2004 | Tankala | C03B 37/01211 65/390 |
| 6,989,508 | B2 * | 1/2006 | Ehrmann | B23K 26/032 219/121.73 |
| 7,116,887 | B2 * | 10/2006 | Farroni | C03B 37/01217 385/142 |
| 7,157,661 | B2 * | 1/2007 | Amako | B23K 26/0608 219/121.73 |
| 7,174,078 | B2 | 2/2007 | Libori et al. | |
| 7,196,339 | B2 | 3/2007 | Namba et al. | |
| 7,257,293 | B1 * | 8/2007 | Fini | G02B 6/02 385/123 |
| 7,318,450 | B2 | 1/2008 | Nobili | |
| 7,463,805 | B2 * | 12/2008 | Li | H01S 3/06708 385/123 |
| 7,526,166 | B2 * | 4/2009 | Bookbinder | G02B 6/02366 385/123 |
| 7,537,395 | B2 * | 5/2009 | Savage-Leuchs | G02B 6/4296 372/6 |
| 7,622,710 | B2 | 11/2009 | Gluckstad | |
| 7,628,865 | B2 | 12/2009 | Singh | |
| 7,876,495 | B1 * | 1/2011 | Minelly | C03B 37/0122 359/341.1 |
| 7,924,500 | B1 * | 4/2011 | Minelly | G02B 6/023 359/341.1 |
| 8,184,363 | B2 * | 5/2012 | Rothenberg | G02B 6/02042 359/349 |
| 8,415,613 | B2 | 4/2013 | Heyn et al. | |
| 8,711,471 | B2 * | 4/2014 | Liu | G02B 6/14 359/337 |
| 8,728,591 | B2 * | 5/2014 | Inada | G02B 1/04 428/1.31 |
| 8,781,269 | B2 * | 7/2014 | Huber | B23K 26/073 385/18 |
| 9,170,367 | B2 * | 10/2015 | Messerly | G02B 6/02 |
| 9,250,390 | B2 * | 2/2016 | Muendel | G02B 6/32 |
| 9,322,989 | B2 * | 4/2016 | Fini | G02B 6/0288 |
| 9,325,151 | B1 * | 4/2016 | Fini | H01S 3/102 |
| 9,339,890 | B2 * | 5/2016 | Woods | B23K 26/06 |
| 9,366,887 | B2 * | 6/2016 | Tayebati | G02F 1/295 |
| 10,295,845 | B2 * | 5/2019 | Kliner | B23K 26/064 |
| 2002/0146202 | A1 * | 10/2002 | Reed | A61B 5/0084 385/34 |
| 2002/0158052 | A1 * | 10/2002 | Ehrmann | B23K 26/032 219/121.69 |
| 2003/0043384 | A1 * | 3/2003 | Hill | G03F 7/70775 356/510 |
| 2003/0059184 | A1 * | 3/2003 | Tankala | C03B 37/01211 385/123 |
| 2003/0095578 | A1 * | 5/2003 | Kopp | G02B 6/02085 372/6 |
| 2003/0152342 | A1 | 8/2003 | Wang et al. | |
| 2003/0174387 | A1 | 9/2003 | Eggleton et al. | |
| 2004/0031779 | A1 | 2/2004 | Cahill et al. | |
| 2004/0086245 | A1 * | 5/2004 | Farroni | C03B 37/01217 385/123 |
| 2004/0208464 | A1 * | 10/2004 | Po | G02B 6/032 385/123 |
| 2005/0017156 | A1 * | 1/2005 | Ehrmann | B23K 26/032 250/216 |
| 2005/0265678 | A1 * | 12/2005 | Manyam | G02B 6/02033 385/127 |
| 2006/0054606 | A1 * | 3/2006 | Amako | B23K 26/0608 219/121.73 |
| 2007/0026676 | A1 | 2/2007 | Li et al. | |
| 2007/0104436 | A1 * | 5/2007 | Li | H01S 3/06708 385/125 |
| 2007/0104438 | A1 * | 5/2007 | Varnham | H01S 3/06708 385/126 |
| 2007/0147751 | A1 * | 6/2007 | Fini | G02B 6/02009 385/123 |
| 2007/0178674 | A1 * | 8/2007 | Imai | B23K 26/0604 438/487 |
| 2007/0195850 | A1 * | 8/2007 | Schluter | H01S 5/4025 372/50.124 |
| 2008/0037604 | A1 * | 2/2008 | Savage-Leuchs | G02B 6/4296 372/44.01 |
| 2008/0154249 | A1 | 6/2008 | Cao | |
| 2008/0181567 | A1 * | 7/2008 | Bookbinder | G02B 6/02366 385/127 |
| 2008/0231939 | A1 | 9/2008 | Gluckstad | |
| 2009/0034059 | A1 * | 2/2009 | Fini | G02B 6/02023 359/341.3 |
| 2009/0059353 | A1 * | 3/2009 | Fini | G02B 6/02009 359/341.3 |
| 2009/0080472 | A1 | 3/2009 | Yao et al. | |
| 2009/0127477 | A1 * | 5/2009 | Tanaka | B23K 26/0738 250/492.22 |

(56) References Cited

U.S. PATENT DOCUMENTS

| | | | |
|---|---|---|---|
| 2009/0129237 A1* | 5/2009 | Chen | G02B 27/0905 369/112.17 |
| 2009/0297140 A1 | 12/2009 | Heismann et al. | |
| 2009/0324233 A1 | 12/2009 | Samartsev et al. | |
| 2010/0067555 A1 | 3/2010 | Austin et al. | |
| 2010/0116794 A1 | 5/2010 | Taido et al. | |
| 2010/0163537 A1* | 7/2010 | Furuta | B23K 26/38 219/121.72 |
| 2010/0251437 A1 | 9/2010 | Heyn et al. | |
| 2010/0252543 A1 | 10/2010 | Manens et al. | |
| 2010/0257641 A1 | 10/2010 | Perkins et al. | |
| 2010/0303419 A1 | 12/2010 | Benjamin et al. | |
| 2011/0032602 A1* | 2/2011 | Rothenberg | G02B 6/02042 359/341.1 |
| 2011/0058250 A1* | 3/2011 | Liu | G02B 6/14 359/341.3 |
| 2011/0163077 A1* | 7/2011 | Partlo | B23K 26/0732 219/121.66 |
| 2011/0243161 A1 | 10/2011 | Tucker et al. | |
| 2011/0297229 A1* | 12/2011 | Gu | G02B 6/4298 136/259 |
| 2012/0009511 A1 | 1/2012 | Dmitriev | |
| 2012/0082410 A1* | 4/2012 | Peng | G02B 6/02304 385/11 |
| 2012/0093461 A1 | 4/2012 | Ramachandran | |
| 2012/0127563 A1 | 5/2012 | Farmer et al. | |
| 2012/0168411 A1* | 7/2012 | Farmer | G02B 19/0052 219/121.67 |
| 2012/0329974 A1* | 12/2012 | Inada | G02B 1/04 527/303 |
| 2013/0134637 A1 | 5/2013 | Wiesner et al. | |
| 2013/0146569 A1* | 6/2013 | Woods | B23K 26/06 219/121.64 |
| 2013/0148925 A1* | 6/2013 | Muendel | G02B 6/32 385/27 |
| 2013/0182725 A1 | 7/2013 | Karlsen et al. | |
| 2013/0202264 A1* | 8/2013 | Messerly | G02B 6/02 385/123 |
| 2013/0223792 A1* | 8/2013 | Huber | B23K 26/073 385/18 |
| 2013/0251324 A1* | 9/2013 | Fini | G02B 6/02009 385/124 |
| 2013/0343703 A1* | 12/2013 | Genier | G02B 6/32 385/33 |
| 2014/0205236 A1* | 7/2014 | Noguchi | G02B 6/2835 385/33 |
| 2014/0259589 A1 | 9/2014 | Xu et al. | |
| 2014/0263209 A1 | 9/2014 | Burris et al. | |
| 2014/0271328 A1 | 9/2014 | Burris et al. | |
| 2014/0334788 A1* | 11/2014 | Fini | G02B 6/0283 427/163.2 |
| 2015/0270089 A1 | 9/2015 | Ghanea-Hercock | |
| 2015/0283613 A1 | 10/2015 | Backlund et al. | |
| 2015/0316716 A1* | 11/2015 | Fini | G02B 6/02009 385/124 |
| 2015/0325977 A1 | 11/2015 | Gu et al. | |
| 2015/0378184 A1* | 12/2015 | Tayebati | G02F 1/295 250/492.1 |
| 2016/0013607 A1* | 1/2016 | McComb | H01S 3/06704 372/6 |
| 2016/0052162 A1 | 2/2016 | Colin et al. | |
| 2016/0059354 A1* | 3/2016 | Sercel | B23K 26/38 264/400 |
| 2016/0114431 A1 | 4/2016 | Cheverton et al. | |
| 2016/0116679 A1 | 4/2016 | Muendel et al. | |
| 2016/0207111 A1 | 7/2016 | Robrecht et al. | |
| 2016/0294150 A1 | 10/2016 | Johnson | |
| 2016/0369332 A1 | 12/2016 | Rothberg et al. | |
| 2017/0120537 A1 | 5/2017 | DeMuth et al. | |
| 2018/0088357 A1* | 3/2018 | Kliner | B23K 26/064 |
| 2018/0088358 A1* | 3/2018 | Kliner | B23K 26/064 |
| 2019/0250398 A1 | 8/2019 | Small et al. | |
| 2019/0258091 A1 | 8/2019 | Kliner et al. | |

FOREIGN PATENT DOCUMENTS

| | | | |
|---|---|---|---|
| CN | 1617003 | | 5/2005 |
| CN | 1327254 | | 7/2007 |
| CN | 101907742 A | * | 12/2010 |
| CN | 102007653 | | 4/2011 |
| CN | 102481664 | | 5/2012 |
| CN | 101907742 B | * | 7/2012 |
| CN | 102549377 | | 7/2012 |
| CN | 102582274 | | 7/2012 |
| CN | 102782540 | | 11/2012 |
| CN | 102844942 | | 12/2012 |
| CN | 103056513 | | 4/2013 |
| CN | 103173760 | | 6/2013 |
| CN | 103490273 | | 1/2014 |
| CN | 103521920 | | 1/2014 |
| CN | 103606803 | | 2/2014 |
| CN | 103999302 | | 8/2014 |
| CN | 104136952 | | 11/2014 |
| CN | 104999670 | | 10/2015 |
| CN | 105383060 | | 3/2016 |
| DE | 4437284 | | 4/1996 |
| DE | 60312826 | | 1/2008 |
| DE | 102009026526 | | 12/2010 |
| DE | 102013205029 | | 6/2014 |
| DE | 10-2013-215362 A1 | | 2/2015 |
| DE | 102013215362 | | 2/2015 |
| DE | 102015103127 | | 9/2016 |
| EP | 0731743 B1 | | 4/1998 |
| EP | 1238745 | | 9/2002 |
| EP | 1681542 | | 7/2006 |
| EP | 1800700 | | 6/2007 |
| EP | 1974848 | | 10/2008 |
| EP | 2886226 | | 6/2015 |
| JP | H06-297168 | | 10/1994 |
| JP | H1 1780 | | 1/1999 |
| JP | 11287922 A | | 10/1999 |
| JP | 11344636 A | | 12/1999 |
| JP | 2003-129862 | | 5/2003 |
| JP | 2004291031 | | 10/2004 |
| JP | 2005070608 A | | 3/2005 |
| JP | 2006-45584 | | 2/2006 |
| JP | 2006-098085 | | 4/2006 |
| JP | 2006-098085 A | | 4/2006 |
| JP | 2009-142866 | | 7/2009 |
| JP | 2009-248157 | | 10/2009 |
| JP | 2012-059920 | | 3/2012 |
| JP | 2012-528011 | | 11/2012 |
| JP | 2016201558 A | | 12/2016 |
| RU | 68715 | | 11/2007 |
| RU | 2365476 | | 8/2009 |
| RU | 2528287 | | 9/2014 |
| RU | 2015112812 | | 10/2016 |
| WO | WO 2003/044914 | | 5/2003 |
| WO | WO 2008/053915 | | 5/2008 |
| WO | WO 2010/029243 | | 3/2010 |
| WO | WO 2011/146407 | | 11/2011 |
| WO | 2012165389 A1 | | 12/2012 |
| WO | WO 2014/074947 | | 5/2014 |
| WO | WO 2014/154901 | | 10/2014 |
| WO | WO 2014/179345 | | 11/2014 |
| WO | WO 2014/180870 | | 11/2014 |
| WO | WO 2015/156281 | | 10/2015 |
| WO | WO 2015/189883 | | 12/2015 |

OTHER PUBLICATIONS

CAILabs, Canuda, Application Note, 2015 (Year: 2015).*
CAILabs, Canuda, Application note, Flexible high-power laser beam shaping (Year: 2015).*
J. M. Daniel, J. S. Chan, J. W. Kim, M. Ibsen, J. Sahu, and W. A. Clarkson, "Novel Technique for Mode Selection in a Large-Mode-Area Fiber Laser," in Conference on Lasers and Electro-Optics 2010, OSA Technical Digest (CD) (Optical Society of America, 2010), paper CWCS (Year: 2010).*
J. M. O. Daniel, J. S. P. Chan, J. W. Kim, J. K. Sahu, M. Ibsen, and W. A. Clarkson, "Novel technique for mode selection in a multimode fiber laser," Opt. Express 19, 12434-12439 (2011) (Year: 2011).*

(56) References Cited

OTHER PUBLICATIONS

Faidel et al., Improvement of selective laser melting by beam shaping and minimized thermally induced effects in optical systems, 9th International Conference on Photonic Technologies Lane 2016 (Year: 2016).*

John M. Fini, "Bend-compensated design of large-mode-area fibers," Opt. Lett. 31, 1963-1965 (2006) (Year: 2006).*

John M. Fini and Jeffrey W. Nicholson, "Bend compensated large-mode-area fibers: achieving robust single-modedness with transformation optics," Opt. Express 21, 19173-19179 (2013) (Year: 2013).*

John M. Fini, "Large mode area fibers with asymmetric bend compensation," Opt. Express 19, 21866-21873 (2011) (Year: 2011).*

Garcia et al., Fast adaptive laser shaping based on multiple laser incoherent combining, Proc. SPIE 10097, High-Power Laser Materials Processing: Applications, Diagnostics, and Systems VI, 1009705 (Feb. 22, 2017); doi: 10.1117/12.2250303 (Year: 2017).*

Huang et al., "All-fiber mode-group-selective photonic lantern using graded-index multimode fibers," Opt. Express 23, 224-234 (2015) (Year: 2015).*

Jain et al., "Multi-Element Fiber Technology for Space-Division Multiplexing Applications," Opt. Express 22, 3787-3796 (2014) (Year : 2014).*

Jin et al., "Mode Coupling Effects in Ring-Core Fibers for Space-Division Multiplexing Systems," in Journal of Lightwave Technology , vol. 34, No. 14, pp. 3365-3372, Jul. 15, 2016. doi: 10.1109/JLT.2016.2564991 (Year: 2016).*

King et al., Observation of keyhole-mode laser melting in laser powder-bed fusion additive manufacturing, Journal of Materials Processing Technology 214 (2014) 2915-2925 (Year: 2014).*

D. A. V. Kliner, "Novel, High-Brightness, Fibre Laser Platform for kW Materials Processing Applications," in 2015 European Conference on Lasers and Electro-Optics—European Quantum Electronics Conference, (Optical Society of America, 2015), paper CJ_11_2. (Year: 2015).*

Kliner D.A.V., Bambha R.P., Do B.T., Farrow R.L., Feve J.-P., Fox B.P., Hadley G.R., Wien G., Overview of Sandia's fiber laser program (2008) Proceedings of SPIE—The International Society for Optical Engineering, 6952 , art. No. 695202 (Year: 2008).*

Koplow et al., "Single-mode operation of a coiled multimode fiber amplifier," Opt. Lett. 25, 442-444 (2000) (Year: 2000).*

Laskin, Applying of refractive spatial beam shapers with scanning optics ICALEO, 941-947 (2011) (Year: 2011).*

Longhi et al., Self-focusing and nonlinear periodic beams in parabolic index optical fibres, Published May 4, 2004 o IOP Publishing Ltd Journal of Optics B: Quantum and Semiclassical Optics, vol. 6, No. 5 (Year: 2004).*

Mumtaz et al., Selective Laser Melting of thin wall parts using pulse shaping, Journal of Materials Processing Technology 210 (2010) 279-287 (Year: 2010).*

Putsch et al., Active optical system for laser structuring of 3D surfaces by remelting, Proc. SPIE 8843, Laser Beam Shaping XIV, 88430D (Sep. 28, 2013); doi: 10.1117/12.2023306 https://www.osapublishing.org/conference.cfm?meetingid=90&yr=2015 (Year: 2013).*

Sandia National Laboratories—Brochure (POC—D.A.V. Kliner); "Mode-Filtered Fiber Amplifier," 2007 (Year: 2007).*

SeGall et al., "Simultaneous laser mode conversion and beam combining using multiplexed volume phase elements," in Advanced Solid-State Lasers Congress, G. Huber and P. Moulton, eds., OSA Technical Digest (online) (Optical Society of America, 2013), paper AW2A.9. (Year: 2013).*

Thiel et al., Reliable Beam Positioning for Metal-based Additive Manufacturing by Means of Focal Shift Reduction, Lasers in Manufacturing Conference 2015. (Year: 2015).*

Van Newkirk et al., "Bending sensor combining multicore fiber with a mode-selective photonic lantern," Opt. Lett. 40, 5188-5191 (2015) (Year: 2015).*

Wischeropp et al., Simulation of the effect of different laser beam intensity profiles on heat distribution in selective laser melting, Lasers in Manufacturing Conference 2015. (Year: 2015).*

Xiao et al., "Fiber coupler for mode selection and high-efficiency pump coupling," Opt. Lett. 38, 1170-1172 (2013) (Year: 2013).*

Ye et al., Mold-free fs laser shock micro forming and its plastic deformation mechanism, Optics and Lasers in Engineering 67 (2015) 74-82. (Year: 2015).*

Yu et al., Laser material processing based on non-conventional beam focusing strategies, 9th International Conference on Photonic Technologies LANE 2016 (Year: 2016).*

Zhirnov et al., Laser beam profiling: experimental study of its influence on single-track formation by selective laser melting, Mechanics & Industry 16, 709 (2015) (Year: 2015).*

Duocastella et al., Bessel and annular beams for materials processing, Laser Photonics Rev. 6, 607-621 (2012) (Year: 2012).*

Fuchs et al., Beam shaping concepts with aspheric surfaces, Proceedings vol. 9581, Laser Beam Shaping XVI; 95810L (2015) https://doi.org/10.1117/12.2186524 (Year: 2015).*

Li et al., High-quality near-field beam achieved in a high-power laser based on SLM adaptive beam-shaping system, Opt. Express 23, 681-689 (2015) (Year: 2015).*

Fleming Ove Olsen, 2011, Laser metal cutting with tailored beam patterns, available at, https://www.industrial-lasers.com/articles/print/volume-26/issue-5/features/laser-metal-cutting-with-tailored-beam-patterns.html (Year: 2011).*

Schulze et al., Mode Coupling in Few-Mode Fibers Induced by Mechanical Stress, Journal of Lightwave Technology, vol. 33, No. 21, Nov. 1, 2015 (Year: 2015).*

Keicher et al., Advancing 3D Printing of Metals and Electronics using Computational Fluid Dynamics, Solid Freeform Fabrication Symposium, Sandia National Laboraties, Aug. 2015 (Year: 2015).*

Birks et al., The photonic lantern, Advances in Optics and Photonics 7, 107-167, 2015 (Year: 2015).*

Mathews et al., Diode-based additive manufacturing of metals using an optically addressable light valve, Optics Express, V. 25, N. 10, May 15, 2017 (Year: 2017).*

Duflou et al., Development of a real time monitoring and adaptive control system for laser flame cutting, ICALEO 2009, 527 (2009); https://doi.org/10.2351/1.5061606 (Year: 2009).*

Jollivet, Clennence, Specialty Fiber Lasers and Novel Fiber Devices, Doctoral Dissertation, University of Central Florida, 2014 (Year: 2014).*

Jollivet et al., Advances in Multi-Core Fiber Lasers, Invited Presentation, DOI: 10.1364/LAOP.2014.LM1D.3.,2014 (Year: 2014).*

Kosolapov et al., Hollow-core revolver fibre with a double-capillary reflective cladding, Quantum Electron. 46 267 (Year: 2016).*

Messerly, et al., Field-flattened, ring-like propagation modes, Optics Express, V. 21, N. 10, p. 12683 (Year: 2013).*

Messerly et al., Patterned flattened modes, Optics Letters, V. 38, N. 17, p. 3329 (Year: 2013).*

Salceda-Delgado et al., Compact fiber-optic curvature sensor based on super-mode interference in a seven-core fiber, Optics Letters, V. 40, N. 7, p. 1468, (Year: 2015).*

Zhang et al., Switchable multiwavelength fiber laser by using a compact in-fiber Mach-Zehnder interferometer, J. Opt. 14 (2012 (045403) (Year: 2012).*

I.V. Zlodeev and O.V. Ivanov, Transmission spectra of a double-clad fibre structure under bending, Quantum Electronics 43 (6) 535-541 (2013) (Year: 2013).*

Tam et al., An imaging fiber-based optical tweezer array for microparticle array assembly, Appl. Phys. Lett. 84, 4289 (2004); https://doi.org/10.1063/1.1753062 (Year: 2004).*

European Patent Office, International Search Report and Written Opinion in PCT/US2018/016288, dated Jun. 11, 2018, 10 pages.

Argyros et al., "Bend loss in highly multimode fibres," *Optics Express*, 16:18590-18598 (Nov. 10, 2008).

Andreasch et al., "Two concentric fiber diameters in one laser light cable," *Optical Components*, No. 1, pp. 38-41 (Jan. 2011).

Applicant-Initiated Interview Summary from U.S. Appl. No. 15/607,399, dated Dec. 26, 2018, 7 pages.

Bai et al., "Effect of Bimodal Powder Mixture on Powder Packing Density and Sintered Density in Binder Jetting of Metals," 26th Annual International Solid Freeform Fabrication Symposium, 14 pages (Aug. 10-12, 2015).

(56) References Cited

OTHER PUBLICATIONS

Balazic, "Additive Manufacturing and 3D Printing LENS Technology," Additive Manufacturing of Metal Components Conference at IK4-Lortek, 52 pages (Nov. 27, 2013).
"Bending Machine," CBC Alta Technologia Italiana, General Catalog, pp. 96-97 (2011).
Brown et al., "Fundamentals of Laser-Material Interaction and Application to Multiscale Surface Modification," Chapter 4, *Laser Precision Microfabrication*, pp. 91-120 (2010).
"Business Unit Laser Ablation and Cutting: Laser Beam Fusion Cutting with Dynamic Beam Shaping," Fraunhofer IWS Annual Report 2015, pp. 86-87 (2015).
Chen et al., "An Algorithm for correction of Distortion of Laser marking Systems," IEEE International Conference on Control and Automation, Guangzhou, China, 5 pages (May 30-Jun. 1, 2007).
Decision of Rejection from the Korean Intellectual Property Office for related Application No. 10-2015-7025813, 6 pages, dated Nov. 29, 2018.
Decombe et al., "Single and dual fiber nano-tip optical tweezers: trapping and analysis," Optics Express, 21:30521-30531 (Dec. 4, 2013).
Dorrington et al., "A simple microcontroller based digital lock-in amplifier for the detection of low level optical signals," Proceedings of the First IEEE International Workshop on Electronic Design, Test and Applications (DELTA '02), 3 pages (2002).
Duflou et al., "Development of a Real Time Monitoring and Adaptive Control System for Laser Flame Cutting," *ICALEO* 2009, 527, 10 pages published online Sep. 27, 2018.
"Enhanced LENS Thermal Imaging Capabilities Introduced by Optomec," OPTOMEC, 4 pages (Jan. 8, 2013).
European Search Report for related Application No. 18173438.5, 3 pages, dated Oct. 5, 2018.
Extended European Search Report for related Application No. 18173438.5, 3 pages, dated Oct. 15, 2018 (with English translation).
Extended European Search Report for related Application No. 16849882.2, 8 pages, dated Apr. 23, 2019.
Fini, "Bend distortion in large-mode-area amplifier fiber design," Proc. of SPIE, 6781:67810E-1-67810E-11 (Nov. 21, 2007).
First Office Action for related Chinese Application No. 201510295923.9, dated Nov. 21, 2018, 6 pages (with English translation).
First Office Action for related Chinese Application No. 201510468218.4, dated Dec. 4, 2018, 14 pages (with English translation).
First Office Action for related Chinese Application No. 201680068424.9, dated Jan. 29, 2019, 10 pages (with English translation).
First Office Action for related Chinese Application No. 201680043132.X, dated May 21, 2019, 21 pages (with English translation).
First Office Action for related Chinese Application No. 201510303469.7, dated Jun. 27, 2019, 18 pages (with English translation).
Goppold et al., "Dynamic Beam Shaping Improves Laser Cutting of Thick Steel Plates," *Industrial Photonics*, 4:18-19 (Jul. 2017).
Heider et al., "Process Stabilization at welding Copper by Laser Power Modulation," *Physics Procedia*, 12:81-87 (2011).
Herwig et al., "Possibilities of power modulation and dynamic beam shaping," Fraunhofer IWS presentation, 6 pages, retrieved on Mar. 16, 2018.
International Preliminary Report on Patentability from International Application No. PCT/US2017/034848, dated Apr. 2, 2019, 9 pages.
International Search Report and Written Opinion from International Application No. PCT/US2018/015768, dated Jun. 11, 2018, 15 pages.
International Search Report and Written Opinion from International Application No. PCT/US2018/016305, dated Jun. 11, 2018, 10 pages.
International Search Report and Written Opinion from International Application No. PCT/US2018/016288, dated Jun. 11, 2018, 10 pages.
International Search Report and Written Opinion from International Application No. PCT/US2018/024145, mailed Jun. 21, 2018, 5 pages.
International Search Report and Written Opinion from International Application No. PCT/US2018/015710, dated Jun. 25, 2018, 17 pages.
International Search Report and Written Opinion from International Application No. PCT/US2018/024548, dated Jun. 28, 2018, 6 pages.
International Search Report and Written Opinion from International Application No. PCT/US2018/024959, dated Jun. 28, 2018, 7 pages.
International Search Report and Written Opinion for International Application No. PCT/US2018/015895, dated Jul. 10, 2018, 10 pages.
International Search Report and Written Opinion from International Application No. PCT/US2018/024510, dated Jul. 12, 2018, 6 pages.
International Search Report and Written Opinion from International Application No. PCT/US2018/024641, dated Jul. 12, 2018, 6 pages.
International Search Report and Written Opinion from International Application No. PCT/US2018/024974, dated Jul. 12, 2018, 6 pages.
International Search Report and Written Opinion from International Application No. PCT/US2018/022629, dated Jul. 26, 2018, 11 pages.
International Search Report and Written Opinion from International Application No. PCT/US2018/024889, dated Jul. 26, 2018, 5 pages.
International Search Report and Written Opinion from International Application No. PCT/US2018/023009, dated Aug. 9, 2018, 8 pages.
International Search Report and Written Opinion from International Application No. PCT/US2018/023012, dated Aug. 9, 2018, 7 pages.
International Search Report and Written Opinion for International Application No. PCT/US2018/024976, dated Aug. 9, 2018, 8 pages.
International Search Report and Written Opinion from International Application No. PCT/US2018/024954, dated Aug. 23, 2018, 7 pages.
International Search Report and Written Opinion from International Application No. PCT/US2018/024958, dated Aug. 23, 2018, 6 pages.
International Search Report and Written Opinion from International Application No. PCT/US2018/024971, dated Aug. 30, 2018, 8 pages.
International Search Report and Written Opinion from International Application No. PCT/US2018/024907, dated Sep. 27, 2018, 6 pages.
Jacobs, "Suggested Guidelines for the Handling of Optical Fiber," White Paper, Corning Incorporated, pp. 1-8 (Dec. 2001).
Keicher et al., "Advanced 3D Printing of Metals and Electronics using Computational Fluid Dynamics," Solid Freeform Fabrication Symposium, 32 pages (Aug. 2015).
Khairallah et al, "Laser power-bed fusion additive manufacturing: Effects of main physical processes on dynamical melt flow and pore formation from mesoscopic powder simulation," Lawrence Livermore National Laboratory, 26 pages (Aug. 20, 2015).
Kruth et al., "On-line monitoring and process control in selective laser melting and laser cutting," *Proceedings of the 5th Lane Conference, laser Assisted Net Shape EnJdneerinR*, vol. 1, 14 pages, (Sep. 1, 2007).
Nazemosadat et al., "Saturable absorption in multicore fiber couplers," *J. Opt. Soc. Am. B*, 30:2787-2790 (Nov. 2013).
Neilson et al., "Free-space optical relay for the interconnection of multimode fibers," *Applied Optics*, 38:2291-2296 (Apr. 10, 1999).
Neilson et al., "Plastic modules for free-space optical interconnects," *Applied Optics*, 37:2944-2952 (May 10, 1998).
Notice of Allowance from U.S. Appl. No. 14/768,595, dated Jul. 1, 2019, 8 pages.
Notice of Allowance and Examiner-Initiated Interview Summary from U.S. Appl. No. 15/607,411, dated Jan. 7, 2019, 14 pages.
Notice of Allowance from U.S. Appl. No. 15/607,399, dated Jun. 4, 2019, 15 pages.
Notice of Allowance from U.S. Appl. No. 15/939,064, dated Aug. 13, 2019, 13 pages.
Notice of Allowance from U.S. Appl. No. 15/938,959, dated Aug. 15, 2019, 13 pages.
Notice of Reasons for Rejection for JP Application No. 2018-527718, 15 pages, dated Dec. 13, 2018 (with English translation).

(56) References Cited

OTHER PUBLICATIONS

Notice of Reasons for Rejection for JP Application No. 2018-527718, 16 pages, dated Jun. 14, 2019 (with English translation).
Office action from U.S. Appl. No. 15/607,399, dated Jan. 11, 2019, 63 pages.
Office action from U.S. Appl. No. 14/768,595, dated Mar. 8, 2019, 8 pages.
Office action from U.S. Appl. No. 15/938,959, dated Apr. 18, 2019, 57 pages.
Office action from U.S. Appl. No. 15/939,064, dated Apr. 18, 2019, 52 pages.
Office action from U.S. Appl. No. 16/402,147, dated Jun. 14, 2019, 10 pages.
Office Action for related Chinese Application No. 201610182805.1, 20 pages, dated Jan. 3, 2019 (with English translation).
Office Action for European Application No. EP 17741945.4, 7 pages, dated Jan. 9, 2019.
Office Action for European Application No. EP 17741945.4, 6 pages, dated Aug. 8, 2019.
Official Letter and Search Report from Taiwan Application No. 106133704, dated Mar. 13, 2019, 29 pages (with English translation).
Purtonen, et al., "Monitoring and Adaptive Control of Laser Processes," *Physics Procedia, Elsevier*, Amsterdam, NL, 56(9):1218-1231 (Sep. 9, 2014).
Sateesh et al., "Effect of Process Parameters on Surface Roughness of Laser Processed Inconel Superalloy," *International Journal of Scientific & Engineering Research*, 5:232-236 (Aug. 2014).
Second Office Action from Chinese Application No. 201510468218.4, dated May 20, 2019, 10 pages (with English translation).
Second Office Action from Chinese Application No. 201680068424.9, dated Jul. 1, 2019, 6 pages (with English translation).
Supplementary European Search Report for Application No. EP 17741945.4, 18 pages, dated Nov. 16, 2018.
"UNI 42 A," Curvatubi elettrica digitale, 5 pages (2016).
"UNI 60 Combi 2," Frame-Grab of YouTube Video, 1 page (Sep. 26, 2011).
Villatoro et al., "Ultrasensitive vector bending sensor based on multicore optical fiber," *Optics Letters*, 41:832-835 (Feb. 15, 2016).
Wang et al., "Mechanisms and characteristics of spatter generation in SLM processing and its effect on the properties," *Materials & Design*, 117(5):121-130 (Mar. 5, 2017).
Xie et al., "Correction of the image distortion for laser galvanometric scanning system," *Optics & Laser Technology*, 37:305-311 (Jun. 2005).

\* cited by examiner

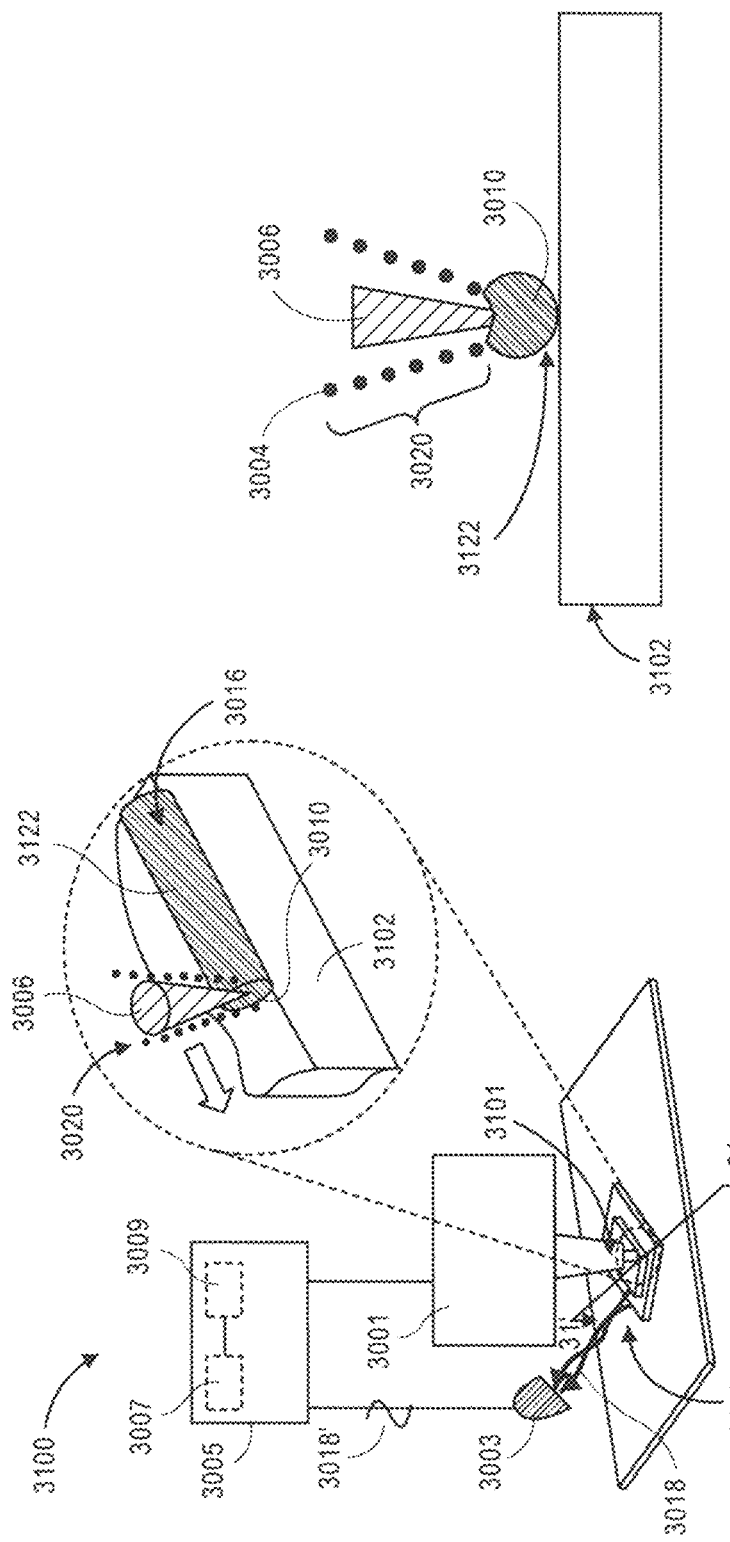

USE OF VARIABLE BEAM PARAMETERS TO CONTROL SOLIDIFICATION OF A MATERIAL

RELATED APPLICATIONS

This application is a continuation-in-part of international application PCT/US2017/034848, filed May 26, 2017, which claims the benefit of U.S. Provisional Application No. 62/401,650, filed Sep. 29, 2016. This application is a continuation-in-part of U.S. patent application Ser. No. 15/607,411, filed May 26, 2017, which claims the benefit of U.S. Provisional Application No. 62/401,650, filed Sep. 29, 2016. This application is a continuation-in-part of U.S. patent application Ser. No. 15/607,410, filed May 26, 2017, which claims the benefit of U.S. Provisional Application No. 62/401,650, filed Sep. 29, 2016. This application is a continuation-in-part of U.S. patent application Ser. No. 15/607,399, filed May 26, 2017, which claims the benefit of U.S. Provisional Application No. 62/401,650, filed Sep. 29, 2016. All of the above applications are herein incorporated by reference in their entireties.

TECHNICAL FIELD

The technology disclosed herein relates to fiber lasers, and fiber-coupled lasers. More particularly, the disclosed technology relates to methods, apparatus, and systems for adjusting and maintaining adjusted optical beam characteristics (spot size, divergence profile, spatial profile, or beam shape, or the like or any combination thereof) at an output of a fiber laser or fiber-coupled laser.

BACKGROUND

The use of high-power fiber-coupled lasers continues to gain popularity for a variety of applications, such as materials processing, cutting, welding, and/or additive manufacturing. These lasers include, for example, fiber lasers, disk lasers, diode lasers, diode-pumped solid state lasers, and lamp-pumped solid state lasers. In these systems, optical power is delivered from the laser to a work piece via an optical fiber.

Various fiber-coupled laser materials processing tasks require different beam characteristics (e.g., spatial profiles and/or divergence profiles). For example, cutting thick metal and welding generally require a larger spot size than cutting thin metal. Ideally, the laser beam properties would be adjustable to enable optimized processing for these different tasks. Conventionally, users have two choices: (1) Employ a laser system with fixed beam characteristics that can be used for different tasks but is not optimal for most of them (i.e., a compromise between performance and flexibility); or (2) Purchase a laser system or accessories that offer variable beam characteristics but that add significant cost, size, weight, complexity, and perhaps performance degradation (e.g., optical loss) or reliability degradation (e.g., reduced robustness or up-time). Currently available laser systems capable of varying beam characteristics require the use of free-space optics or other complex and expensive add-on mechanisms (e.g., zoom lenses, mirrors, translatable or motorized lenses, combiners, etc.) in order to vary beam characteristics. No solution exists that provides the desired adjustability in beam characteristics that minimizes or eliminates reliance on the use of free-space optics or other extra components that add significant penalties in terms of cost, complexity, performance, and/or reliability. What is needed is an in-fiber apparatus for providing varying beam characteristics that does not require or minimizes the use of free-space optics and that can avoid significant cost, complexity, performance tradeoffs, and/or reliability degradation.

During material processing with high power lasers, several detrimental effects can occur that limit the process outcome, application-specific performance, or utility of the final product. These detrimental effects can include residual stress, distortion, cracking, undesirable microstructure, poor dilution, or unacceptable size and orientation of the solidified grain structure. Each of these effects directly relate to quality and performance metrics of the laser-processed product such as strength, ductility, toughness, fatigue performance, and service life.

Manufacturing techniques that can rely on laser-melting of materials, such as additive manufacturing (also known as 3D printing) which can be used to form articles layer-by-layer and others such as laser-welding which can be used to fuse materials (e.g., different components) together, and laser-cutting for cutting through or separating materials can result in a change of material properties such as microstructure, including the crystal structure of the material, during solidification. However, specific control of the solidification for example, in-real time, to tailor the material properties is limited.

Therefore, methods for controlling properties of laser-processed materials while overcoming the limitations of conventional processes to provided improved articles would be a welcome addition to the art.

SUMMARY

At least disclosed herein are methods, systems and apparatus for varying optical beam characteristics. Methods may include, perturbing an optical beam propagating within a first length of fiber to adjust one or more beam characteristics of the optical beam in the first length of fiber or a second length of fiber or a combination thereof, coupling the perturbed optical beam into a second length of fiber and maintaining at least a portion of one or more adjusted beam characteristics within a second length of fiber having one or more confinement regions. Methods may further include generating a selected output beam from the second length of fiber having the adjusted beam characteristics responsive to a selection of a first refractive index profile (RIP) of the first length of fiber or a second RIP of the second length of fiber or a combination thereof. In some examples, the one or more beam characteristics of the perturbed optical beam are adjusted based on selection of one or more core dimensions of the first length of fiber or one or more confinement region dimensions of the second length of fiber or a combination thereof to generate an adjusted optical beam responsive to perturbing the first length of fiber, the adjusted optical beam having a particular adjusted: beam diameter, divergence distribution, beam parameter product (BPP), intensity distribution, luminance, $M^2$ value, numerical aperture (NA), optical intensity, power density, radial beam position, radiance, or spot size, or any combination thereof at an output of the second length of fiber. In some example, methods include perturbing the optical beam by bending the first length of fiber to alter a bend radius or alter a length of a bent region of the first length of fiber or a combination thereof such that one or more modes of the optical beam are displaced radially with respect to a longitudinal axis of the first length of fiber wherein the second length of fiber has an RIP that defines a first confinement region and a second confinement region. In some examples, the adjusted one or more beam characteristics are produced by confining the optical beam in the two or more confinement regions of the second length of fiber. The example methods may further comprise launching the perturbed optical beam from the first length of fiber into the first confinement region or the second confinement region or a combination thereof such that one or more displaced modes of the optical beam are selectively coupled into and maintained in the first confinement region or the second confinement region, or a combination thereof. Disclosed methods may include, perturbing the one or more beam characteristics of the optical beam by perturbing the first length of fiber or the optical beam in the first length of fiber or a combination thereof to adjust at least one beam characteristic of the optical beam at an output of the second length of fiber. Perturbing the first length of fiber may include bending, bending over a particular length, microbending, applying acousto-optic excitation, thermal perturbation, stretching, or applying piezo-electric perturbation, or any combination thereof. The second length of fiber may comprise a first confinement region comprising a central core and a second confinement region comprising an annular core encompassing the first confinement region. Adjusting the one or more beam characteristics of the optical beam may include selecting a RIP of the first length of fiber to generate a desired mode shape of a lowest order mode, one or more higher order modes, or a combination thereof subsequent to the adjusting. In some examples, the first length of fiber has a core with a parabolic index profile radially spanning some or all of the core. A RIP of the first length of fiber may be selected to increase or decrease a width of the lowest order mode, the higher order modes, or a combination thereof responsive to the perturbing the optical beam. The first length of fiber or the second length of fiber or a combination thereof may include at least one divergence structure configured to modify a divergence profile of the optical beam. The confinement regions may be separated by one or more cladding structures, wherein the divergence structure may be disposed within at least one confinement region separate from the cladding structure and comprising material having a lower index than the confinement region adjacent to the divergence structure. In some examples, the second length of fiber may be azimuthally asymmetric.

Apparatus disclosed herein may include an optical beam delivery device, comprising a first length of fiber comprising a first RIP formed to enable modification of one or more beam characteristics of an optical beam by a perturbation device and a second length of fiber having a second RIP coupled to the first length of fiber, the second RIP formed to confine at least a portion of the modified beam characteristics of the optical beam within one or more confinement regions. In some examples, the first RIP and the second RIP are different. In some examples, the second length of fiber comprises a plurality of confinement regions. The perturbation device may be coupled to the first length of fiber or integral with the first length of fiber or a combination thereof. The first length of fiber may comprise a graded-index RIP in at least a radially central portion and the second length of fiber has a first confinement region comprising a central core and a second confinement region that is annular and encompasses the first confinement region. The first confinement region and the second confinement region may be separated by a cladding structure having a refractive index that is lower than the indexes of first confinement region and the second confinement region. The cladding structure may comprise a fluorosilicate material. The first length of fiber or the second length of fiber or a combination thereof may include at least one divergence structure configured to modify a divergence profile of the optical beam and wherein the divergence structure may comprise a first material having a lower index of refraction than a second material encompassing the divergence structure. The second length of fiber may be azimuthally asymmetric and may comprise a first confinement region comprising a first core and a second confinement region comprising a second core. In some examples, the first confinement region and the second confinement region may be coaxial. In other examples, the first confinement region and the second confinement region may be non-coaxial. The second confinement region may be crescent shaped in some examples. The first RIP may be parabolic in a first portion having a first radius. In some examples, the first RIP may be constant in a second portion having a second radius, wherein the second radius is larger than the first radius. The first RIP may comprise a radially graded index extending to an edge of a core of the first length of fiber, wherein the first RIP is formed to increase or decrease a width of one or more modes of the optical beam responsive to the modification of the beam characteristics by the perturbation device. The first length of fiber may have a radially graded index core extending to a first radius followed by a constant index portion extending to a second radius, wherein the second radius is larger than the first radius. In some examples, the second length of fiber comprises a central core having a diameter in a range of about 0 to 100 microns, a first annual core encompassing the central core having a diameter in a range of about 10 to 600 microns and a second annual core having a diameter in a range of about 20 to 1200 microns. The perturbation device may comprise a bending assembly configured to alter a bend radius or alter a bend length of the first length of fiber or a combination thereof to modify the beam characteristics of the optical beam. In some examples, a perturbation assembly may comprise a bending assembly, a mandrel, micro-bend in the fiber, an acousto-optic transducer, a thermal device, a fiber stretcher, or a piezo-electric device, or any combination thereof. The first length of fiber and the second length of fiber may be separate passive fibers that are spliced together.

Systems disclosed herein may include, an optical beam delivery system, comprising an optical fiber including a first and second length of fiber and an optical system coupled to the second length of fiber including one or more free-space optics configured to receive and transmit an optical beam comprising modified beam characteristics. The first length of fiber may include a first RIP formed to enable, at least in part, modification of one or more beam characteristics of an optical beam by a perturbation assembly arranged to modify the one or more beam characteristics, the perturbation assembly may be coupled to the first length of fiber or integral with the first length of fiber, or a combination thereof. The second length of fiber may be coupled to the first length of fiber and may include a second RIP formed to preserve at least a portion of the one or more beam characteristics of the optical beam modified by the perturbation assembly within one or more first confinement regions. In some examples, the first RIP and the second RIP are different.

The optical beam delivery system may further include a first process fiber coupled between a first process head and the optical system, wherein the first process fiber is configured to receive the optical beam comprising the modified one or more beam characteristics. The first process fiber may comprise a third RIP configured to preserve at least a portion of the modified one or more beam characteristics of the optical beam within one or more second confinement regions of the first process fiber. In an example, at least a portion of the free-space optics may be configured to further modify the modified one or more beam characteristics of the optical beam. The one or more beam characteristics may include beam diameter, divergence distribution, BPP, intensity distribution, luminance, $M^2$ value, NA, optical intensity, power density, radial beam position, radiance, or spot size, or any combination thereof. The third RIP may be the same as or different from the second RIP. The third RIP may be configured to further modify the modified one or more beam characteristics of the optical beam. In some examples, at least one of the one or more second confinement regions includes at least one divergence structure configured to modify a divergence profile of the optical beam. The divergence structure may comprise an area of lower-index material than that of the second confinement region.

The optical beam delivery system may further include a second process fiber having a fourth RIP that is coupled between the optical system and a second process head, wherein the second process fiber may be configured to receive the optical beam comprising the modified one or more beam characteristics within one or more second confinement regions of the second process fiber. In some examples, the first process fiber or the second process fiber or a combination thereof may be configured to further modify the modified one or more beam characteristics of the optical beam. The second process fiber may include at least one divergence structure configured to modify a divergence profile of the optical beam. The second process fiber may comprise a central core surrounded by at least one of the one or more second confinement regions, wherein the core and the second confinement region are separated by a cladding structure having a first index of refraction that is lower than a second index of refraction of the central core and a third index of refraction of the second confinement region, wherein the second confinement region may include the at least one divergence structure. The at least one divergence structure may comprise an area of lower-index material than that of the second confinement region. In an example, the second RIP may be different from the third RIP or the fourth RIP or a combination thereof. Alternatively, the second RIP may be the same as the third RIP or the fourth RIP or a combination thereof. The one or more beam characteristics that may be modified can include beam diameter, divergence distribution, BPP, intensity distribution, luminance, $M^2$ value, NA, optical intensity, power density, radial beam position, radiance, or spot size, or any combination thereof.

In some examples, at least a portion of the free-space optics may be configured to further modify the modified one or more beam characteristics of the optical beam. The first process fiber may be coupled between a first process head and the optical system, wherein the first process fiber is configured to receive the optical beam comprising twice modified one or more beam characteristics. The first process fiber may have a third RIP configured to preserve at least a portion of the twice modified one or more beam characteristics of the optical beam within one or more second confinement regions of the first process fiber. The third RIP may be different from the second RIP, wherein the third RIP is configured to further modify the twice modified one or more beam characteristics of the optical beam.

In some examples, the first process fiber may include a divergence structure configured to further modify the twice modified one or more beam characteristics of the optical beam. In some examples, a second process fiber may be coupled between the optical system and a second process head, wherein the second process fiber is configured to receive the twice modified one or more beam characteristics.

In some examples, the first process fiber or the second process fiber or a combination thereof is configured to further modify the twice modified one or more beam characteristics of the optical beam. The first process fiber or the second process fiber or a combination thereof may include at least one divergence structure configured to further modify the twice modified one or more beam characteristics of the optical beam. The optical system may be a fiber-to-fiber coupler, a fiber-to-fiber switch or a process head, or the like or a combination thereof.

The present disclosure is further directed to a method for forming an article. The method comprises: providing a material comprising a first material property; forming a melt pool by exposing the material to an optical beam comprising at least one beam characteristic, wherein the melt pool comprises at least one melt pool property determinative of a second material property of the material; and modifying the at least one beam characteristic in response to a change in the melt pool property.

The present disclosure is further directed to an optical beam system. The optical beam system comprises: an optical beam delivery device, comprising a first length of fiber having a first refractive-index profile (RIP), a second length coupled to the first length of fiber and having a second RIP and one or more confinement regions, and a perturbation device configured to modify one or more beam characteristics of an optical beam in one or more of the first length of fiber and in the second length of fiber, or in the first and second lengths of fiber, wherein the first RIP differs from the second RIP and wherein the second RIP is configured to confine at least a portion of the modified one or more beam characteristics of the optical beam within the one or more confinement regions of the second length of fiber. The optical beam system further comprises a sensor that generates a signal in response to sensing a signature of a melt pool property; and a feedback subsystem in communication with the optical beam delivery device and the sensor. The feedback subsystem comprises at least one memory to store data and instructions; and at least one processor configured to receive the signal, access the at least one memory, and execute the instructions.

The methods, systems and apparatus as described herein provide for, among other things, fewer or elimination of post-processing steps such as hot isostatic pressing (HIP) for additive manufacturing, or other heat treatment (e.g., hardening, solutionizing, precipitation hardening, tempering, annealing, etc.).

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

FIG. 31A illustrates an example additive manufacturing system that incorporates aspects of the laser system of FIG. 30.

FIG. 31B is a cross-sectional view of a build layer formed by the additive manufacturing system of FIG. 31A.

DETAILED DESCRIPTION

Figure 1:
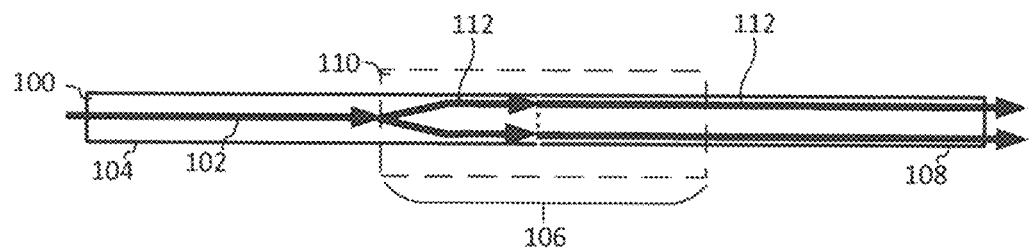
FIG. 1 illustrates an example fiber structure for providing a laser beam having variable beam characteristics.

As used herein throughout this disclosure and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Also, the terms "modify" and "adjust" are used interchangeably to mean "alter."

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Definitions

Definitions of words and terms as used herein:

1. The term "beam characteristics" refers to one or more of the following terms used to describe an optical beam. In general, the beam characteristics of most interest depend on the specifics of the application or optical system.

2. The term "beam diameter" is defined as the distance across the center of the beam along an axis for which the irradiance (intensity) equals $1/e^2$ of the maximum irradiance. While examples disclosed herein generally use beams that propagate in azimuthally symmetric modes, elliptical or other beam shapes can be used, and beam diameter can be different along different axes. Circular beams are characterized by a single beam diameter. Other beam shapes can have different beam diameters along different axes.

3. The term "spot size" is the radial distance (radius) from the center point of maximum irradiance to the $1/e^2$ point.

4. The term "beam divergence distribution" is the power vs the full cone angle. This quantity is sometimes called the "angular distribution" or "NA distribution."

5. The term "beam parameter product" (BPP) of a laser beam is defined as the product of the beam radius (measured at the beam waist) and the beam divergence half-angle (measured in the far field). The units of BPP are typically mm-mrad.
6. A "confinement fiber" is defined to be a fiber that possesses one or more confinement regions, wherein a confinement region comprises a higher-index region (core region) surrounded by a lower-index region (cladding region). The RIP of a confinement fiber may include one or more higher-index regions (core regions) surrounded by lower-index regions (cladding regions), wherein light is guided in the higher-index regions. Each confinement region and each cladding region can have any RIP, including but not limited to step-index and graded-index. The confinement regions may or may not be concentric and may be a variety of shapes such as circular, annular, polygonal, arcuate, elliptical, or irregular, or the like or any combination thereof. The confinement regions in a particular confinement fiber may all have the same shape or may be different shapes. Moreover, confinement regions may be co-axial or may have offset axes with respect to one another. Confinement regions may be of uniform thickness about a central axis in the longitudinal direction, or the thicknesses may vary about the central axis in the longitudinal direction.
7. The term "intensity distribution" refers to optical intensity as a function of position along a line (1D profile) or on a plane (2D profile). The line or plane is usually taken perpendicular to the propagation direction of the light. It is a quantitative property.
8. "Luminance" is a photometric measure of the luminous intensity per unit area of light travelling in a given direction.
9. "$M^2$ factor" (also called "beam quality factor" or "beam propagation factor") is a dimensionless parameter for quantifying the beam quality of laser beams, with $M^2=1$ being a diffraction-limited beam, and larger M2 values corresponding to lower beam quality. $M^2$ is equal to the BPP divided by $\lambda/\Pi$, where $\lambda$ is the wavelength of the beam in microns (if BPP is expressed in units of mm-mrad).
10. The term "numerical aperture" or "NA" of an optical system is a dimensionless number that characterizes the range of angles over which the system can accept or emit light.
11. The term "optical intensity" is not an official (SI) unit, but is used to denote incident power per unit area on a surface or passing through a plane.
12. The term "power density" refers to optical power per unit area, although this is also referred to as "optical intensity."
13. The term "radial beam position" refers to the position of a beam in a fiber measured with respect to the center of the fiber core in a direction perpendicular to the fiber axis.
14. "Radiance" is the radiation emitted per unit solid angle in a given direction by a unit area of an optical source (e.g., a laser). Radiance may be altered by changing the beam intensity distribution and/or beam divergence profile or distribution. The ability to vary the power density (also referred to as the radiance profile) of a laser beam implies the ability to vary the BPP.
15. The term "refractive-index profile" or "RIP" refers to the refractive index as a function of position along a line (1D) or in a plane (2D) perpendicular to the fiber axis. Many fibers are azimuthally symmetric, in which case the 1D RIP is identical for any azimuthal angle.
16. A "step-index fiber" has a RIP that is flat (refractive index independent of position) within the fiber core.
17. A "graded-index fiber" has a RIP in which the refractive index decreases with increasing radial position (i.e., with increasing distance from the center of the fiber core).
18. A "parabolic-index fiber" is a specific case of a graded-index fiber in which the refractive index decreases quadratically with increasing distance from the center of the fiber core.

Fiber for Varying Beam Characteristics

Disclosed herein are methods, systems, and apparatus configured to provide a fiber operable to provide a laser beam having variable beam characteristics (VBC) that may reduce cost, complexity, optical loss, or other drawbacks of the conventional methods described above. This VBC fiber is configured to vary a wide variety of optical beam characteristics. Such beam characteristics can be controlled using the VBC fiber thus allowing users to tune various beam characteristics to suit the particular requirements of an extensive variety of laser processing applications. For example, a VBC fiber may be used to tune: beam diameter, beam divergence distribution, BPP, intensity distribution, $M^2$ factor, NA, optical intensity, power density, radial beam position, radiance, spot size, or the like, or any combination thereof.

In general, the disclosed technology entails coupling a laser beam into a fiber in which the characteristics of the laser beam in the fiber can be adjusted by perturbing the laser beam and/or perturbing a first length of fiber by any of a variety of methods (e.g., bending the fiber or introducing one or more other perturbations) and fully or partially maintaining adjusted beam characteristics in a second length of fiber. The second length of fiber is specially configured to maintain and/or further modify the adjusted beam characteristics. In some cases, the second length of fiber preserves the adjusted beam characteristics through delivery of the laser beam to its ultimate use (e.g., materials processing). The first and second lengths of fiber may comprise the same or different fibers.

The disclosed technology is compatible with fiber lasers and fiber-coupled lasers. Fiber-coupled lasers typically deliver an output via a delivery fiber having a step-index refractive index profile (RIP), i.e., a flat or constant refractive index within the fiber core. In reality, the RIP of the delivery fiber may not be perfectly flat, depending on the design of the fiber. Important parameters are the fiber core diameter ($d_{core}$) and NA. The core diameter is typically in the range of 10-1000 micron (although other values are possible), and the NA is typically in the range of 0.06-0.22 (although other values are possible). A delivery fiber from the laser may be routed directly to the process head or work piece, or it may be routed to a fiber-to-fiber coupler (FFC) or fiber-to-fiber switch (FFS), which couples the light from the delivery fiber into a process fiber that transmits the beam to the process head or the work piece.

Most materials processing tools, especially those at high power (>1 kW), employ multimode (MM) fiber, but some employ single-mode (SM) fiber, which is at the lower end of the $d_{core}$ and NA ranges. The beam characteristics from a SM fiber are uniquely determined by the fiber parameters. The beam characteristics from a MM fiber, however, can vary (unit-to-unit and/or as a function of laser power and time), depending on the beam characteristics from the laser source (s) coupled into the fiber, the launching or splicing conditions into the fiber, the fiber RIP, and the static and dynamic geometry of the fiber (bending, coiling, motion, microbending, etc.). For both SM and MM delivery fibers, the beam characteristics may not be optimum for a given materials processing task, and it is unlikely to be optimum for a range of tasks, motivating the desire to be able to systematically vary the beam characteristics in order to customize or optimize them for a particular processing task.

In one example, the VBC fiber may have a first length and a second length and may be configured to be interposed as an in-fiber device between the delivery fiber and the process head to provide the desired adjustability of the beam characteristics. To enable adjustment of the beam, a perturbation device and/or assembly is disposed in close proximity to and/or coupled with the VBC fiber and is responsible for perturbing the beam in a first length such that the beam's characteristics are altered in the first length of fiber, and the altered characteristics are preserved or further altered as the beam propagates in the second length of fiber. The perturbed beam is launched into a second length of the VBC fiber configured to conserve adjusted beam characteristics. The first and second lengths of fiber may be the same or different fibers and/or the second length of fiber may comprise a confinement fiber. The beam characteristics that are conserved by the second length of VBC fiber may include any of: beam diameter, beam divergence distribution, BPP, intensity distribution, luminance, $M^2$ factor, NA, optical intensity, power density, radial beam position, radiance, spot size, or the like, or any combination thereof.

FIG. 1 illustrates an example VBC fiber 100 for providing a laser beam having variable beam characteristics without requiring the use of free-space optics to change the beam characteristics. VBC fiber 100 comprises a first length of fiber 104 and a second length of fiber 108. First length of fiber 104 and second length of fiber 108 may be the same or different fibers and may have the same or different RIPs. The first length of fiber 104 and the second length of fiber 108 may be joined together by a splice. First length of fiber 104 and second length of fiber 108 may be coupled in other ways, may be spaced apart, or may be connected via an interposing component such as another length of fiber, free-space optics, glue, index-matching material, or the like or any combination thereof.

A perturbation device 110 is disposed proximal to and/or envelops perturbation region 106. Perturbation device 110 may be a device, assembly, in-fiber structure, and/or other feature. Perturbation device 110 at least perturbs optical beam 102 in first length of fiber 104 or second length of fiber 108 or a combination thereof in order to adjust one or more beam characteristics of optical beam 102. Adjustment of beam 102 responsive to perturbation by perturbation device 110 may occur in first length of fiber 104 or second length of fiber 108 or a combination thereof. Perturbation region 106 may extend over various widths and may or may not extend into a portion of second length of fiber 108. As beam 102 propagates in VBC fiber 100, perturbation device 110 may physically act on VBC fiber 100 to perturb the fiber and adjust the characteristics of beam 102. Alternatively, perturbation device 110 may act directly on beam 102 to alter its beam characteristics. Subsequent to being adjusted, perturbed beam 112 has different beam characteristics than beam 102, which will be fully or partially conserved in second length of fiber 108. In another example, perturbation device 110 need not be disposed near a splice. Moreover, a splice may not be needed at all, for example VBC fiber 100 may be a single fiber, first length of fiber and second length of fiber could be spaced apart, or secured with a small gap (air-spaced or filled with an optical material, such as optical cement or an index-matching material).

Perturbed beam 112 is launched into second length of fiber 108, where perturbed beam 112 characteristics are largely maintained or continue to evolve as perturbed beam 112 propagates yielding the adjusted beam characteristics at the output of second length of fiber 108. In one example, the new beam characteristics may include an adjusted intensity distribution. In an example, an altered beam intensity distribution will be conserved in various structurally bounded confinement regions of second length of fiber 108. Thus, the beam intensity distribution may be tuned to a desired beam intensity distribution optimized for a particular laser processing task. In general, the intensity distribution of perturbed beam 112 will evolve as it propagates in the second length of fiber 108 to fill the confinement region(s) into which perturbed beam 112 is launched responsive to conditions in first length of fiber 104 and perturbation caused by perturbation device 110. In addition, the angular distribution may evolve as the beam propagates in the second fiber, depending on launch conditions and fiber characteristics. In general, fibers largely preserve the input divergence distribution, but the distribution can be broadened if the input divergence distribution is narrow and/or if the fiber has irregularities or deliberate features that perturb the divergence distribution. The various confinement regions, perturbations, and fiber features of second length of fiber 108 are described in greater detail below. Beams 102 and 112 are conceptual abstractions intended to illustrate how a beam may propagate through a VBC fiber 100 for providing variable beam characteristics and are not intended to closely model the behavior of a particular optical beam.

VBC fiber 100 may be manufactured by a variety of methods including PCVD (Plasma Chemical Vapor Deposition), OVD (Outside Vapor Deposition), VAD (Vapor Axial Deposition), MOCVD (Metal-Organic Chemical Vapor Deposition.) and/or DND (Direct Nanoparticle Deposition). VBC fiber 100 may comprise a variety of materials. For example, VBC fiber 100 may comprise $SiO_2$, $SiO_2$ doped with $GeO_2$, germanosilicate, phosphorus pentoxide, phosphosilicate, $Al_2O_3$, aluminosilicate, or the like or any combinations thereof. Confinement regions may be bounded by cladding doped with fluorine, boron, or the like or any combinations thereof. Other dopants may be added to active fibers, including rare-earth ions such as $Er^{3+}$ (erbium), $Yb^{3+}$ (ytterbium), $Nd^{3+}$ (neodymium), $Tm^{3+}$ (thulium), $Ho^{3+}$ (holmium), or the like or any combination thereof. Confinement regions may be bounded by cladding having a lower index than the confinement region with fluorine or boron doping. Alternatively, VBC fiber 100 may comprise photonic crystal fibers or micro-structured fibers.

VBC fiber 100 is suitable for use in any of a variety of fiber, fiber optic, or fiber laser devices, including continuous wave and pulsed fiber lasers, disk lasers, solid state lasers, or diode lasers (pulse rate unlimited except by physical constraints). Furthermore, implementations in a planar waveguide or other types of waveguides and not just fibers are within the scope of the claimed technology.

Figure 2:
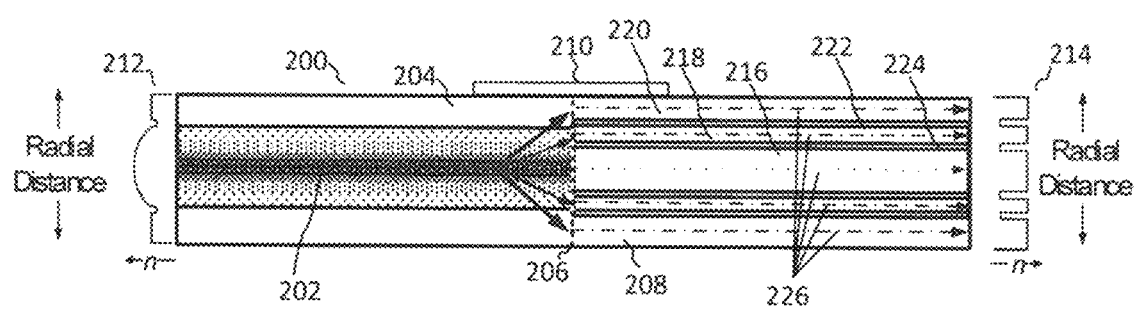
FIG. 2 depicts a cross-sectional view of an example fiber structure for delivering a beam with variable beam characteristics.

FIG. 2 depicts a cross-sectional view of an example VBC fiber 200 for adjusting beam characteristics of an optical beam. In an example, VBC fiber 200 may be a process fiber because it may deliver the beam to a process head for material processing. VBC fiber 200 comprises a first length of fiber 204 spliced at junction 206 to a second length of fiber 208. A perturbation assembly 210 is disposed proximal to junction 206. Perturbation assembly 210 may be any of a variety of devices configured to enable adjustment of the beam characteristics of an optical beam 202 propagating in VBC fiber 200. In an example, perturbation assembly 210 may be a mandrel and/or another device that may provide means of varying the bend radius and/or bend length of VBC fiber 200 near the splice. Other examples of perturbation devices are discussed below with respect to FIG. 24.

In an example, first length of fiber 204 has a parabolic-index RIP 212 as indicated by the left RIP graph. Most of the intensity distribution of beam 202 is concentrated in the center of fiber 204 when fiber 204 is straight or nearly straight. Second length of fiber 208 is a confinement fiber having RIP 214 as shown in the right RIP graph. Second length of fiber 208 includes confinement regions 216, 218 and 220. Confinement region 216 is a central core surrounded by two annular (or ring-shaped) confinement regions 218 and 220. Layers 222 and 224 are structural barriers of lower index material between confinement regions (216, 218 and 220), commonly referred to as "cladding" regions. In one example, layers 222 and 224 may comprise rings of fluorosilicate; in some embodiments, the fluorosilicate cladding layers are relatively thin. Other materials may be used as well and claimed subject matter is not limited in this regard.

In an example, as beam 202 propagates along VBC fiber 200, perturbation assembly 210 may physically act on fiber 208 and/or beam 202 to adjust its beam characteristics and generate adjusted beam 226. In the current example, the intensity distribution of beam 202 is modified by perturbation assembly 210. Subsequent to adjustment of beam 202 the intensity distribution of adjusted beam 226 may be concentrated in outer confinement regions 218 and 220 with relatively little intensity in the central confinement region 216. Because each of confinement regions 216, 218, and/or 220 is isolated by the thin layers of lower index material in barrier layers 222 and 224, second length of fiber 208 can substantially maintain the adjusted intensity distribution of adjusted beam 226. The beam will typically become distributed azimuthally within a given confinement region but will not transition (significantly) between the confinement regions as it propagates along the second length of fiber 208. Thus, the adjusted beam characteristics of adjusted beam 226 are largely conserved within the isolated confinement regions 216, 218, and/or 220. In some cases, it be may desirable to have the beam 226 power divided among the confinement regions 216, 218, and/or 220 rather than concentrated in a single region, and this condition may be achieved by generating an appropriately adjusted beam 226.

In one example, core confinement region 216 and annular confinement regions 218 and 220 may be composed of fused silica glass, and cladding 222 and 224 defining the confinement regions may be composed of fluorosilicate glass. Other materials may be used to form the various confinement regions (216, 218 and 220), including germanosilicate, phosphosilicate, aluminosilicate, or the like, or a combination thereof and claimed subject matter is not so limited. Other materials may be used to form the barrier rings (222 and 224), including fused silica, borosilicate, or the like or a combination thereof, and claimed subject matter is not so limited. In other embodiments, the optical fibers or waveguides include or are composed of various polymers or plastics or crystalline materials. Generally, the core confinement regions have refractive indices that are greater than the refractive indices of adjacent barrier/cladding regions.

In some examples, it may be desirable to increase a number of confinement regions in a second length of fiber to increase granularity of beam control over beam displacements for fine-tuning a beam profile. For example, confinement regions may be configured to provide stepwise beam displacement.

Figure 3:
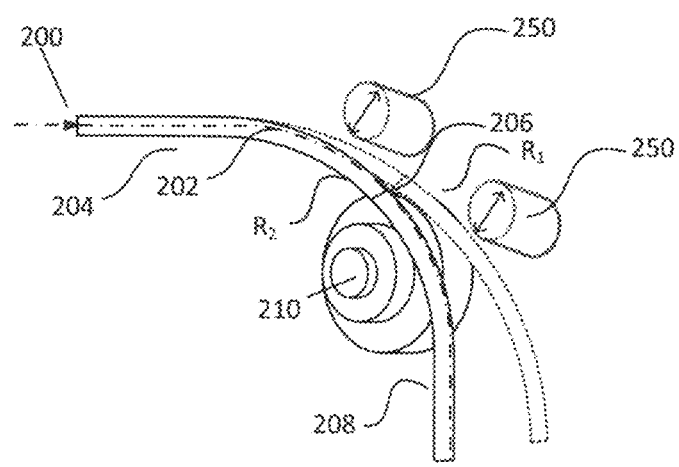
FIG. 3 illustrates an example method of perturbing a fiber structure for providing a beam having variable beam characteristics.

FIG. 3 illustrates an example method of perturbing fiber 200 for providing variable beam characteristics of an optical beam. Changing the bend radius of a fiber may change the radial beam position, divergence angle, and/or radiance profile of a beam within the fiber. The bend radius of VBC fiber 200 can be decreased from a first bend radius $R_1$ to a second bend radius $R_2$ about splice junction 206 by using a stepped mandrel or cone as the perturbation assembly 210. Additionally or alternatively, the engagement length on the mandrel(s) or cone can be varied. Rollers 250 may be employed to engage VBC fiber 200 across perturbation assembly 210. In an example, an amount of engagement of rollers 250 with fiber 200 has been shown to shift the distribution of the intensity profile to the outer confinement regions 218 and 220 of fiber 200 with a fixed mandrel radius. There are a variety of other methods for varying the bend radius of fiber 200, such as using a clamping assembly, flexible tubing, or the like, or a combination thereof, and claimed subject matter is not limited in this regard. In another example, for a particular bend radius the length over which VBC fiber 200 is bent can also vary beam characteristics in a controlled and reproducible way. In examples, changing the bend radius and/or length over which the fiber is bent at a particular bend radius also modifies the intensity distribution of the beam such that one or more modes may be shifted radially away from the center of a fiber core.

Maintaining the bend radius of the fibers across junction 206 ensures that the adjusted beam characteristics such as radial beam position and radiance profile of optical beam 202 will not return to beam 202's unperturbed state before being launched into second length of fiber 208. Moreover, the adjusted radial beam characteristics, including position, divergence angle, and/or intensity distribution, of adjusted beam 226 can be varied based on an extent of decrease in the bend radius and/or the extent of the bent length of VBC fiber 200. Thus, specific beam characteristics may be obtained using this method.

In the current example, first length of fiber 204 having first RIP 212 is spliced at junction 206 to a second length of fiber 208 having a second RIP 214. However, it is possible to use a single fiber having a single RIP formed to enable perturbation (e.g., by micro-bending) of the beam characteristics of beam 202 and also to enable conservation of the adjusted beam. Such a RIP may be similar to the RIPs shown in fibers illustrated in FIGS. 17, 18, and/or 19.

Figure 4:
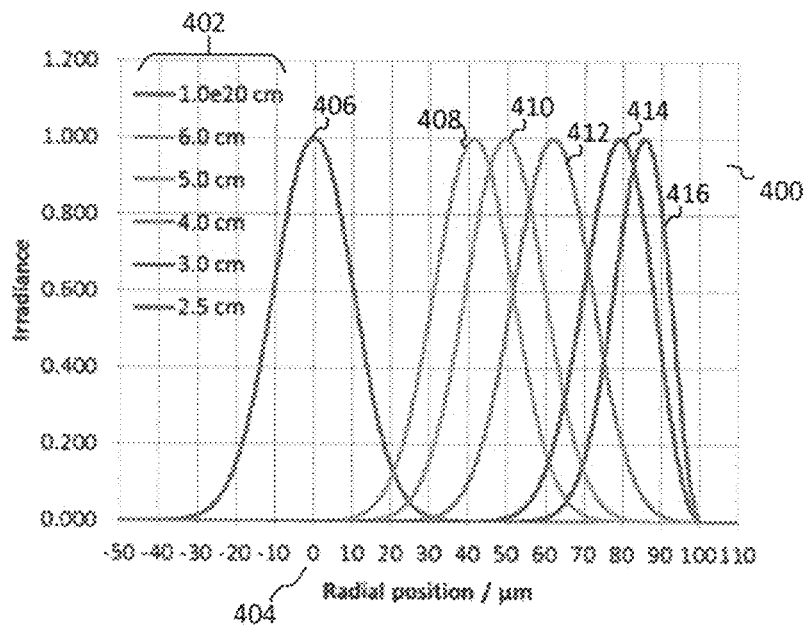
FIG. 4 is a graph illustrating the calculated spatial profile of the lowest-order mode ($LP_{01}$) for a first length of a fiber for different fiber bend radii.
Figure 5:
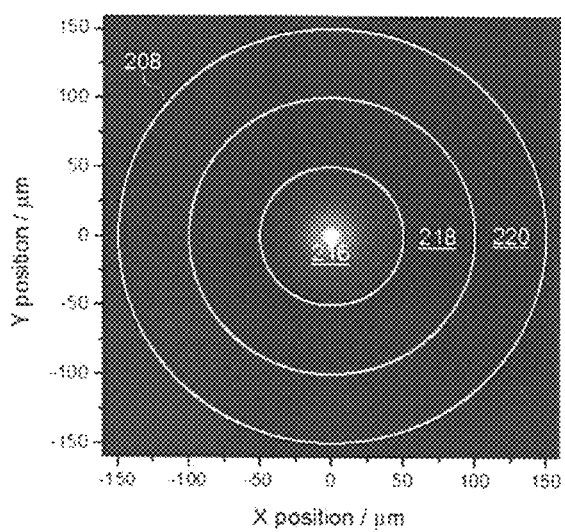
FIG. 5 illustrates an example of a two-dimensional intensity distribution at a junction when a fiber for varying beam characteristics is nearly straight.
Figure 6:
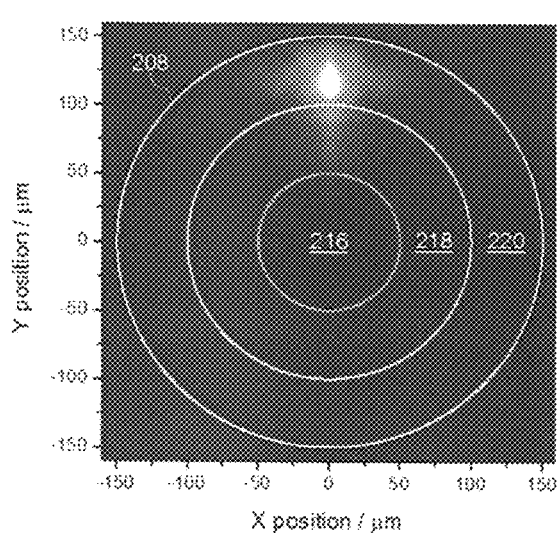
FIG. 6 illustrates an example of a two-dimensional intensity distribution at a junction when a fiber for varying beam characteristics is bent with a radius chosen to preferentially excite a particular confinement region of a second length of fiber.

FIGS. 7-10 provide experimental results for VBC fiber 200 (shown in FIGS. 2 and 3) and illustrate further a beam response to perturbation of VBC fiber 200 when a perturbation assembly 210 acts on VBC fiber 200 to bend the fiber. FIGS. 4-6 are simulations and FIGS. 7-10 are experimental results wherein a beam from a SM 1050 nm source was launched into an input fiber (not shown) with a 40 micron core diameter. The input fiber was spliced to first length of fiber 204.

FIG. 4 is an example graph 400 illustrating the calculated profile of the lowest-order mode ($LP_{01}$) for a first length of fiber 204 for different fiber bend radii 402, wherein a perturbation assembly 210 involves bending VBC fiber 200. As the fiber bend radius is decreased, an optical beam propagating in VBC fiber 200 is adjusted such that the mode shifts radially away from the center 404 of a VBC fiber 200 core (r=0 micron) toward the core/cladding interface (located at r=100 micron in this example). Higher-order modes ($LP_{ln}$) also shift with bending. Thus, a straight or nearly straight fiber (very large bend radius), curve 406 for $LP_{01}$ is centered at or near the center 404 of VBC fiber 200. At a bend radius of about 6 cm, curve 408 for $LP_{01}$ is shifted to a radial position of about 40 µm from the center 406 of VBC fiber 200. At a bend radius of about 5 cm, curve 410 for $LP_{01}$ is shifted to a radial position about 50 µm from the center 404 of VBC fiber 200. At a bend radius of about 4 cm, curve 412 for $LP_{01}$ is shifted to a radial position about 60 µm from the center 404 of VBC fiber 200. At a bend radius of about 3 cm, curve 414 for $LP_{01}$ is shifted to a radial position about 80 µm from the center 404 of VBC fiber 200. At a bend radius of about 2.5 cm, a curve 416 for $LP_{01}$ is shifted to a radial position about 85 µm from the center 404 of VBC fiber 200. Note that the shape of the mode remains relatively constant (until it approaches the edge of the core), which is a specific property of a parabolic RIP. Although, this property may be desirable in some situations, it is not required for the VBC functionality, and other RIPs may be employed.

In an example, if VBC fiber 200 is straightened, $LP_{01}$ mode will shift back toward the center of the fiber. Thus, the purpose of second length of fiber 208 is to "trap" or confine the adjusted intensity distribution of the beam in a confinement region that is displaced from the center of the VBC fiber 200. The splice between fibers 204 and 208 is included in the bent region, thus the shifted mode profile will be preferentially launched into one of the ring-shaped confinement regions 218 and 220 or be distributed among the confinement regions. FIGS. 5 and 6 illustrate this effect.

FIG. 5 illustrates an example two-dimensional intensity distribution at junction 206 within second length of fiber 208 when VBC fiber 200 is nearly straight. A significant portion of $LP_{01}$ and $LP_{In}$ are within confinement region 216 of fiber 208. FIG. 6 illustrates the two-dimensional intensity distribution at junction 206 within second length of fiber 208 when VBC fiber 200 is bent with a radius chosen to preferentially excite confinement region 220 (the outermost confinement region) of second length of fiber 208. A significant portion of $LP_{01}$ and $LP_{In}$ are within confinement region 220 of fiber 208.

In an example, second length of fiber 208 confinement region 216 has a 100 micron diameter, confinement region 218 is between 120 micron and 200 micron in diameter, and confinement region 220 is between 220 micron and 300 micron diameter. Confinement regions 216, 218, and 220 are separated by 10 um thick rings of fluorosilicate, providing an NA of 0.22 for the confinement regions. Other inner and outer diameters for the confinement regions, thicknesses of the rings separating the confinement regions, NA values for the confinement regions, and numbers of confinement regions may be employed.

Referring again to FIG. 5, with the noted parameters, when VBC fiber 200 is straight about 90% of the power is contained within the central confinement region 216, and about 100% of the power is contained within confinement regions 216 and 218. Referring now to FIG. 6, when fiber 200 is bent to preferentially excite second ring confinement region 220, nearly 75% of the power is contained within confinement region 220, and more than 95% of the power is contained within confinement regions 218 and 220. These calculations include $LP_{01}$ and two higher-order modes, which is typical in some 2-4 kW fiber lasers.

It is clear from FIGS. 5 and 6 that in the case where a perturbation assembly 210 acts on VBC fiber 200 to bend the fiber, the bend radius determines the spatial overlap of the modal intensity distribution of the first length of fiber 204 with the different guiding confinement regions (216, 218, and 220) of the second length of fiber 208. Changing the bend radius can thus change the intensity distribution at the output of the second length of fiber 208, thereby changing the diameter or spot size of the beam, and thus also changing its radiance and BPP value. This adjustment of the spot size may be accomplished in an all-fiber structure, involving no free-space optics and consequently may reduce or eliminate the disadvantages of free-space optics discussed above. Such adjustments can also be made with other perturbation assemblies that alter bend radius, bend length, fiber tension, temperature, or other perturbations discussed below.

In a typical materials processing system (e.g., a cutting or welding tool), the output of the process fiber is imaged at or near the work piece by the process head. Varying the intensity distribution as shown in FIGS. 5 and 6 thus enables variation of the beam profile at the work piece in order to tune and/or optimize the process, as desired. Specific RIPs for the two fibers were assumed for the purpose of the above calculations, but other RIPs are possible, and claimed subject matter is not limited in this regard.

FIGS. 7-10 depict experimental results (measured intensity distributions) to illustrate further output beams for various bend radii of VBC fiber 200 shown in FIG. 2.

Figure 7:
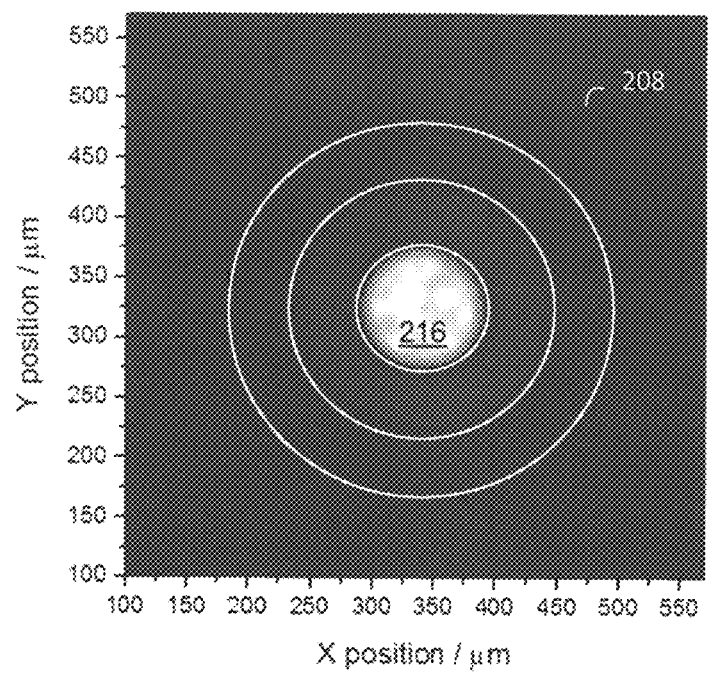
FIGS. 7-10 depict experimental results to illustrate further output beams for various bend radii of a fiber for varying beam characteristics shown in FIG. 2.
Figure 8:
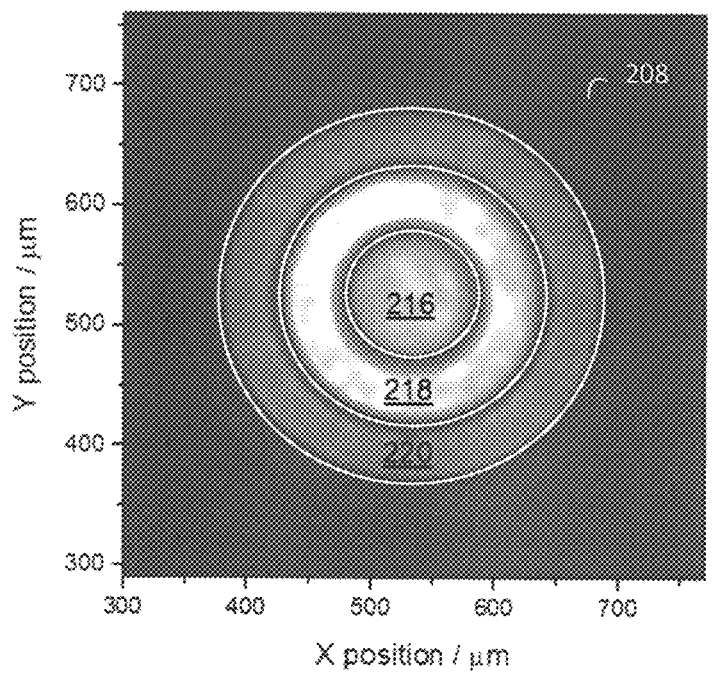
Figure 9:
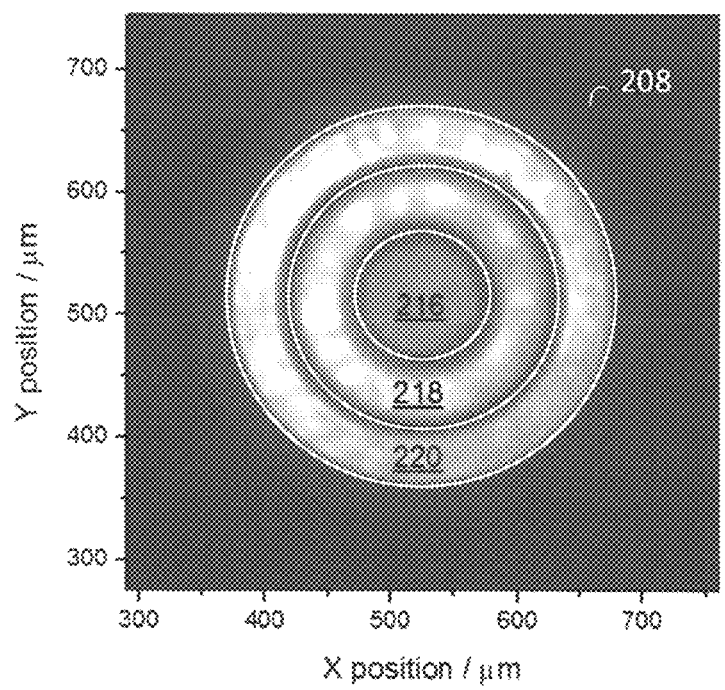
Figure 10:
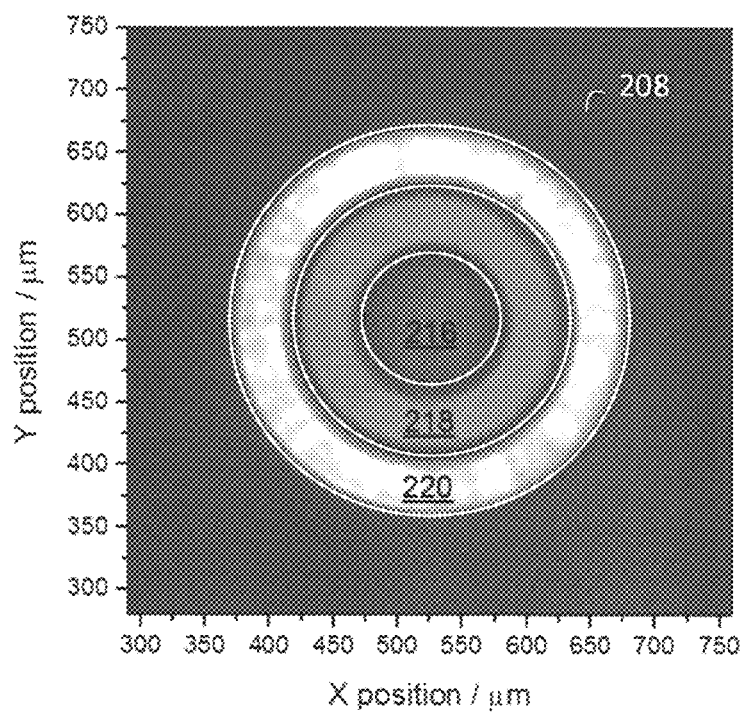

In FIG. 7 when VBC fiber 200 is straight, the beam is nearly completely confined to confinement region 216. As the bend radius is decreased, the intensity distribution shifts to higher diameters (FIGS. 8-10). FIG. 8 depicts the intensity distribution when the bend radius of VBC fiber 200 is chosen to shift the intensity distribution preferentially to confinement region 218. FIG. 9 depicts the experimental results when the bend radius is further reduced and chosen to shift the intensity distribution outward to confinement region 220 and confinement region 218. In FIG. 10, at the smallest bend radius, the beam is nearly a "donut mode", with most of the intensity in the outermost confinement region 220.

Despite excitation of the confinement regions from one side at the splice junction 206, the intensity distributions are nearly symmetric azimuthally because of scrambling within confinement regions as the beam propagates within the VBC fiber 200. Although the beam will typically scramble azimuthally as it propagates, various structures or perturbations (e.g., coils) could be included to facilitate this process.

For the fiber parameters used in the experiment shown in FIGS. 7-10, particular confinement regions were not exclusively excited because some intensity was present in multiple confinement regions. This feature may enable advantageous materials processing applications that are optimized by having a flatter or distributed beam intensity distribution. In applications requiring cleaner excitation of a given confinement region, different fiber RIPs could be employed to enable this feature.

The results shown in FIGS. 7-10 pertain to the particular fibers used in this experiment, and the details will vary depending on the specifics of the implementation. In particular, the spatial profile and divergence distribution of the output beam and their dependence on bend radius will depend on the specific RIPs employed, on the splice parameters, and on the characteristics of the laser source launched into the first fiber.

Different fiber parameters than those shown in FIG. 2 may be used and still be within the scope of the claimed subject matter. Specifically, different RIPs and core sizes and shapes may be used to facilitate compatibility with different input beam profiles and to enable different output beam characteristics. Example RIPs for the first length of fiber, in addition to the parabolic-index profile shown in FIG. 2, include other graded-index profiles, step-index, pedestal designs (i.e., nested cores with progressively lower refractive indices with increasing distance from the center of the fiber), and designs with nested cores with the same refractive index value but with various NA values for the central core and the surrounding rings. Example RIPs for the second length of fiber, in addition to the profile shown in FIG. 2, include confinement fibers with different numbers of confinement regions, non-uniform confinement-region thicknesses, different and/or non-uniform values for the thicknesses of the rings surrounding the confinement regions, different and/or non-uniform NA values for the confinement regions, different refractive-index values for the high-index and low-index portions of the RIP, non-circular confinement regions (such as elliptical, oval, polygonal, square, rectangular, or combinations thereof), as well as other designs as discussed in further detail with respect to FIGS. 26-28. Furthermore, VBC fiber 200 and other examples of a VBC fiber described herein are not restricted to use of two fibers. In some examples, implementation may include use of one fiber or more than two fibers. In some cases, the fiber(s) may not be axially uniform; for example, they could include fiber Bragg gratings or long-period gratings, or the diameter could vary along the length of the fiber. In addition, the fibers do not have to be azimuthally symmetric, e.g., the core(s) could have square or polygonal shapes. Various fiber coatings (buffers) may be employed, including high-index or index-matched coatings (which strip light at the glass-polymer interface) and low-index coatings (which guide light by total internal reflection at the glass-polymer interface). In some examples, multiple fiber coatings may be used on VBC fiber 200.

FIGS. 11-16 illustrate cross-sectional views of examples of first lengths of fiber for enabling adjustment of beam characteristics in a VBC fiber responsive to perturbation of an optical beam propagating in the first lengths of fiber. Some examples of beam characteristics that may be adjusted in the first length of fiber are: beam diameter, beam divergence distribution, BPP, intensity distribution, luminance, $M^2$ factor, NA, optical intensity profile, power density profile, radial beam position, radiance, spot size, or the like, or any combination thereof. The first lengths of fiber depicted in FIGS. 11-16 and described below are merely examples and do not provide an exhaustive recitation of the variety of first lengths of fiber that may be utilized to enable adjustment of beam characteristics in a VBC fiber assembly. Selection of materials, appropriate RIPs, and other variables for the first lengths of fiber illustrated in FIGS. 11-16 at least depend on a desired beam output. A wide variety of fiber variables are contemplated and are within the scope of the claimed subject matter. Thus, claimed subject matter is not limited by examples provided herein.

Figure 11:
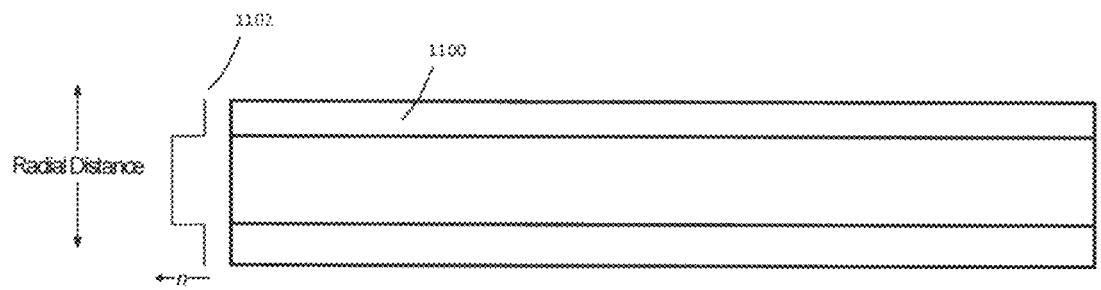
FIGS. 11-16 illustrate cross-sectional views of example first lengths of fiber for enabling adjustment of beam characteristics in a fiber assembly.
Figure 12:
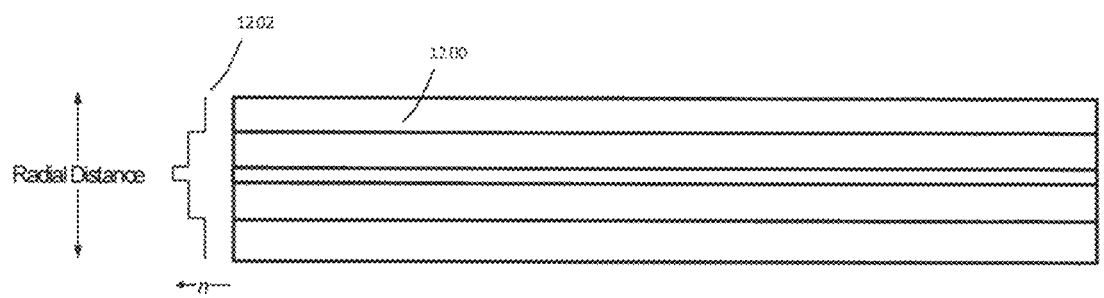
Figure 13:
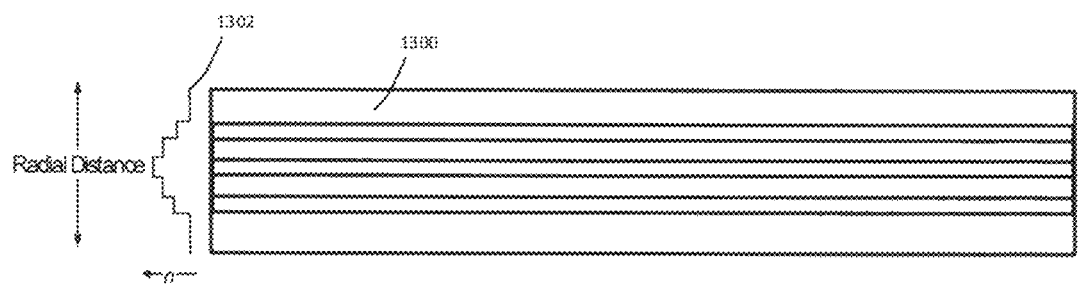

In FIG. 11 first length of fiber 1100 comprises a step-index profile 1102. FIG. 12 illustrates a first length of fiber 1200 comprising a "pedestal RIP" (i.e., a core comprising a step-index region surrounded by a larger step-index region) 1202. FIG. 13 illustrates first length of fiber 1300 comprising a multiple-pedestal RIP 1302.

Figure 14A:
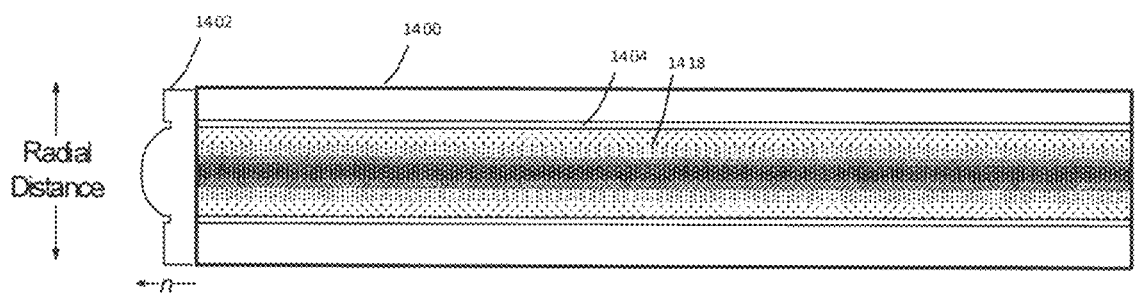

FIG. 14A illustrates first length of fiber 1400 comprising a graded-index profile 1418 surrounded by a down-doped region 1404. Fiber 1400 has a RIP 1402. When the fiber 1400 is perturbed, modes may shift radially outward in fiber 1400 (e.g., during bending of fiber 1400). Graded-index profile 1418 may be designed to promote maintenance or even compression of modal shape. This design may promote adjustment of a beam propagating in fiber 1400 to generate a beam having a beam intensity distribution concentrated in an outer perimeter of the fiber (i.e., in a portion of the fiber core that is displaced from the fiber axis). As described above, when the adjusted beam is coupled into a second length of fiber having confinement regions, the intensity distribution of the adjusted beam may be trapped in the outermost confinement region, providing a donut shaped intensity distribution. A beam spot having a narrow outer confinement region may be useful to enable certain material processing actions.

Figure 14B:
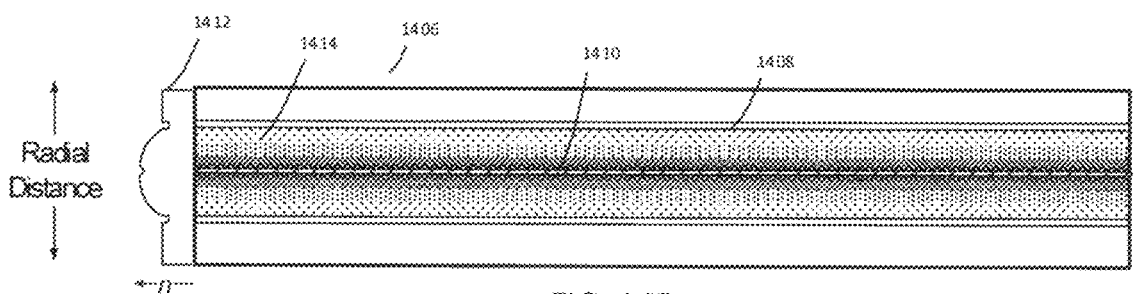

FIG. 14B illustrates first length of fiber 1406 comprising a graded-index profile 1414 surrounded by a down-doped region 1408 similar to fiber 1400. However, fiber 1406 includes a divergence structure 1410 (a lower-index region) as can be seen in RIP 1412. The divergence structure 1410 is an area of material with a lower refractive index than that of the surrounding core. As the beam is launched into first length of fiber 1406, refraction from divergence structure 1410 causes the beam divergence to increase in first length of fiber 1406. The amount of increased divergence depends on the amount of spatial overlap of the beam with the divergence structure 1410 and the magnitude of the index difference between the divergence structure 1410 and the core material. Divergence structure 1410 can have a variety of shapes, depending on the input divergence distribution and desired output divergence distribution. In an example, divergence structure 1410 has a triangular or graded index shape.

Figure 15:
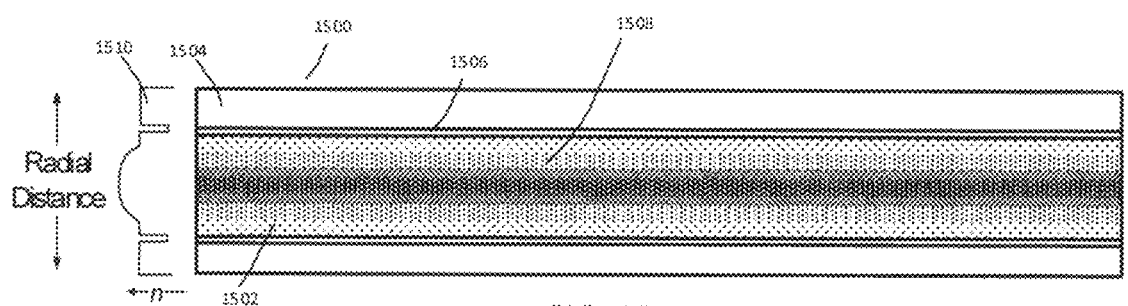

FIG. 15 illustrates a first length of fiber 1500 comprising a parabolic-index central region 1502 surrounded by a constant-index region 1504, and the constant-index region 1504 is surrounded by a lower-index annular layer 1506. The lower-index annular layer 1506 helps guide a beam propagating in fiber 1500. When the propagating beam is perturbed, modes shift radially outward in fiber 1500 (e.g., during bending of fiber 1500). As one or more modes shift radially outward, parabolic-index region 1502 promotes retention of modal shape. When the modes reach the constant-index region 1504 of the RIP 1510, they will be compressed against the low-index annular layer 1506, which may cause preferential excitation of the outermost confinement region in the second fiber (in comparison to the first fiber RIP shown in FIG. 14). In one implementation, this fiber design works with a confinement fiber having a central step-index core and a single annular core. The parabolic-index portion 1502 of the RIP overlaps with the central step-index core of the confinement fiber. The constant-index portion 1504 overlaps with the annular core of the confinement fiber. The constant-index portion 1504 of the first fiber is intended to make it easier to move the beam into overlap with the annular core by bending. This fiber design also works with other designs of the confinement fiber.

Figure 16:
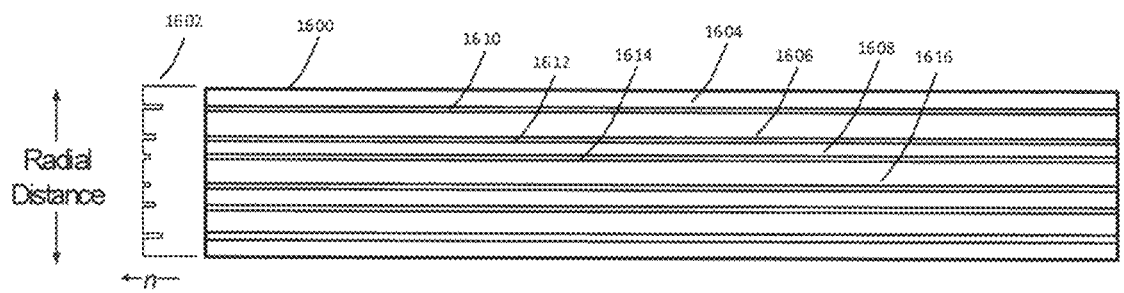

FIG. 16 illustrates a first length of fiber 1600 comprising guiding regions 1604, 1606, 1608, and 1616 bounded by lower-index layers 1610, 1612, and 1614 where the indexes of the lower-index layers 1610, 1612, and 1614 are stepped or, more generally, do not all have the same value as illustrated by RIP 1602. The lower-index layers may serve to bound the beam intensity to certain guiding regions (1604, 1606, 1608, and 1616) when the perturbation assembly 210 (see FIG. 2) acts on the fiber 1600. In this way, adjusted beam light may be trapped in the guiding regions over a range of perturbation actions (such as over a range of bend radii, a range of bend lengths, a range of micro-bending pressures, and/or a range of acousto-optical signals), allowing for a certain degree of perturbation tolerance before a beam intensity distribution is shifted to a more distant radial position in fiber 1600. Thus, variation in beam characteristics may be controlled in a step-wise fashion. The radial widths of the guiding regions 1604, 1606, 1608, and 1616 may be adjusted to achieve a desired ring width, as may be required by an application. Also, a guiding region can have a thicker radial width to facilitate trapping of a larger fraction of the incoming beam profile if desired. Region 1606 is an example of such a design.

FIGS. 17-21 depict examples of fibers configured to enable maintenance and/or confinement of adjusted beam characteristics in the second length of fiber (e.g., fiber 208). These fiber designs are referred to as "ring-shaped confinement fibers" because they contain a central core surrounded by annular or ring-shaped cores. These designs are merely examples and not an exhaustive recitation of the variety of fiber RIPs that may be used to enable maintenance and/or confinement of adjusted beam characteristics within a fiber. Thus, claimed subject matter is not limited to the examples provided herein. Moreover, any of the first lengths of fiber described above with respect to FIGS. 11-16 may be combined with any of the second length of fiber described FIGS. 17-21.

Figure 17:
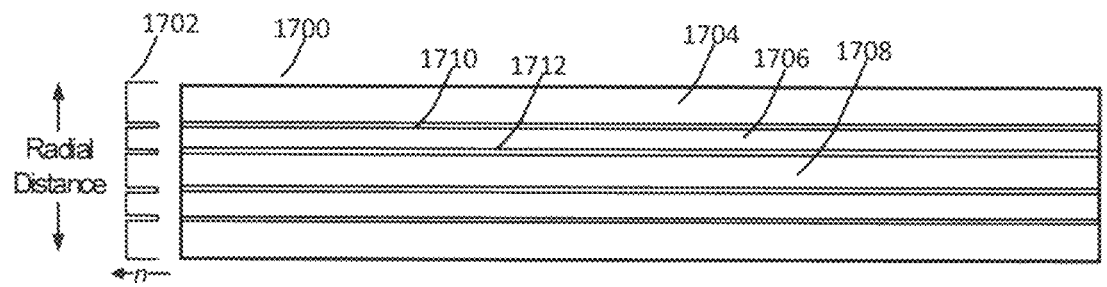
FIGS. 17-19 illustrate cross-sectional views of example second lengths of fiber ("confinement fibers") for confining adjusted beam characteristics in a fiber assembly.

FIG. 17 illustrates a cross-sectional view of an example second length of fiber for maintaining and/or confining adjusted beam characteristics in a VBC fiber assembly. As the perturbed beam is coupled from a first length of fiber to second length of fiber 1700, the second length of fiber 1700 may maintain at least a portion of the beam characteristics adjusted in response to perturbation in the first length of fiber within one or more of confinement regions 1704, 1706, and/or 1708. Fiber 1700 has a RIP 1702. Each of confinement regions 1704, 1706, and/or 1708 is bounded by a lower index layer 1710 and/or 1712. This design enables second length of fiber 1700 to maintain the adjusted beam characteristics. As a result, a beam output by fiber 1700 will substantially maintain the received adjusted beam as modified in the first length of fiber giving the output beam adjusted beam characteristics, which may be customized to a processing task or other application.

Figure 18:
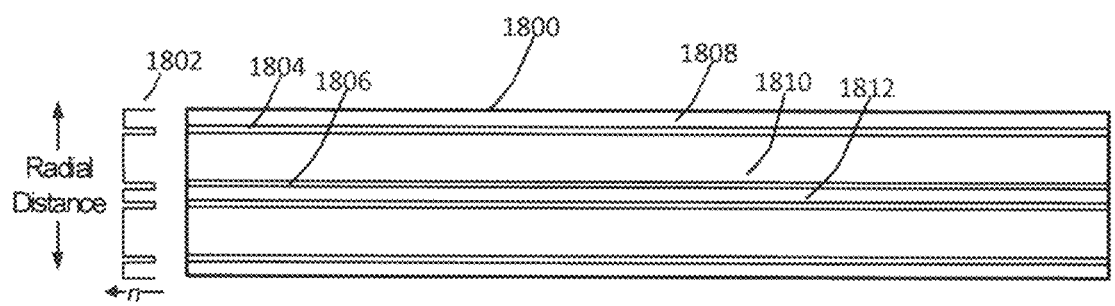

Similarly, FIG. 18 depicts a cross-sectional view of an example second length of fiber 1800 for maintaining and/or confining beam characteristics adjusted in response to perturbation in the first length of fiber in a VBC fiber assembly. Fiber 1800 has a RIP 1802. However, confinement regions 1808, 1810, and/or 1812 have different thicknesses than confinement regions 1704, 1706, and 1708. Each of confinement regions 1808, 1810, and/or 1812 is bounded by a lower index layer 1804 and/or 1806. Varying the thicknesses of the confinement regions (and/or barrier regions) enables tailoring or optimization of a confined adjusted radiance profile by selecting particular radial positions within which to confine an adjusted beam.

Figure 19:
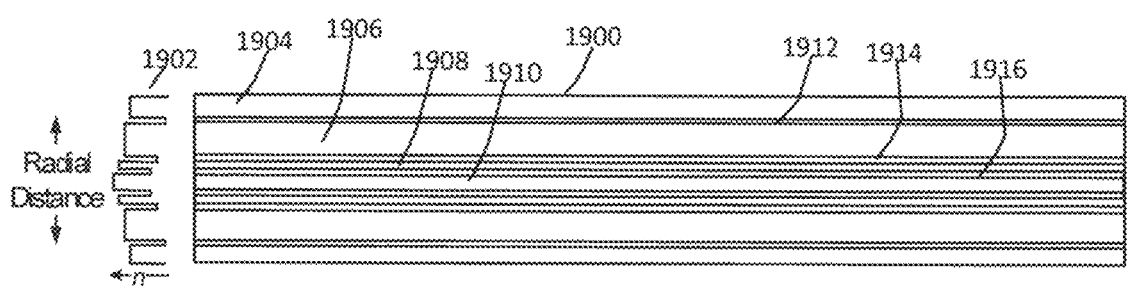

FIG. 19 depicts a cross-sectional view of an example second length of fiber 1900 having a RIP 1902 for maintaining and/or confining an adjusted beam in a VBC fiber assembly configured to provide variable beam characteristics. In this example, the number and thicknesses of confinement regions 1904, 1906, 1908, and 1910 are different from fiber 1700 and 1800 and the barrier layers 1912, 1914, and 1916 are of varied thicknesses as well. Furthermore, confinement regions 1904, 1906, 1908, and 1910 have different indexes of refraction and barrier layers 1912, 1914, and 1916 have different indexes of refraction as well. This design may further enable a more granular or optimized tailoring of the confinement and/or maintenance of an adjusted beam radiance to particular radial locations within fiber 1900. As the perturbed beam is launched from a first length of fiber to second length of fiber 1900 the modified beam characteristics of the beam (having an adjusted intensity distribution, radial position, and/or divergence angle, or the like, or a combination thereof) is confined within a specific radius by one or more of confinement regions 1904, 1906, 1908 and/or 1910 of second length of fiber 1900.

As noted previously, the divergence angle of a beam may be conserved or adjusted and then conserved in the second length of fiber. There are a variety of methods to change the divergence angle of a beam. The following are examples of fibers configured to enable adjustment of the divergence angle of a beam propagating from a first length of fiber to a second length of fiber in a fiber assembly for varying beam characteristics. However, these are merely examples and not an exhaustive recitation of the variety of methods that may be used to enable adjustment of divergence of a beam. Thus, claimed subject matter is not limited to the examples provided herein.

Figure 20:
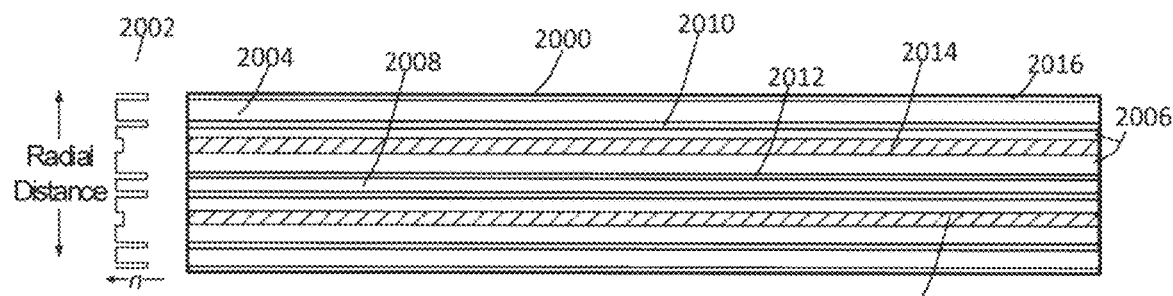
FIGS. 20 and 21 illustrate cross-sectional views of example second lengths of fiber for changing a divergence angle of and confining an adjusted beam in a fiber assembly configured to provide variable beam characteristics.

FIG. 20 depicts a cross-sectional view of an example second length of fiber 2000 having RIP 2002 for modifying, maintaining, and/or confining beam characteristics adjusted in response to perturbation in the first length of fiber. In this example, second length of fiber 2000 is similar to the previously described second lengths of fiber and forms a portion of the VBC fiber assembly for delivering variable beam characteristics as discussed above. There are three confinement regions 2004, 2006, and 2008 and three barrier layers 2010, 2012, and 2016. Second length of fiber 2000 also has a divergence structure 2014 situated within the confinement region 2006. The divergence structure 2014 is an area of material with a lower refractive index than that of the surrounding confinement region. As the beam is launched into second length of fiber 2000 refraction from divergence structure 2014 causes the beam divergence to increase in second length of fiber 2000. The amount of increased divergence depends on the amount of spatial overlap of the beam with the divergence structure 2014 and the magnitude of the index difference between the divergence structure 2014 and the core material. By adjusting the radial position of the beam near the launch point into the second length of fiber 2000, the divergence distribution may be varied. The adjusted divergence of the beam is conserved in fiber 2000, which is configured to deliver the adjusted beam to the process head, another optical system (e.g., fiber-to-fiber coupler or fiber-to-fiber switch), the work piece, or the like, or a combination thereof. In an example, divergence structure 2014 may have an index dip of about $10^{-5}$-$3\times10^{-2}$ with respect to the surrounding material. Other values of the index dip may be employed within the scope of this disclosure and claimed subject matter is not so limited.

Figure 21:
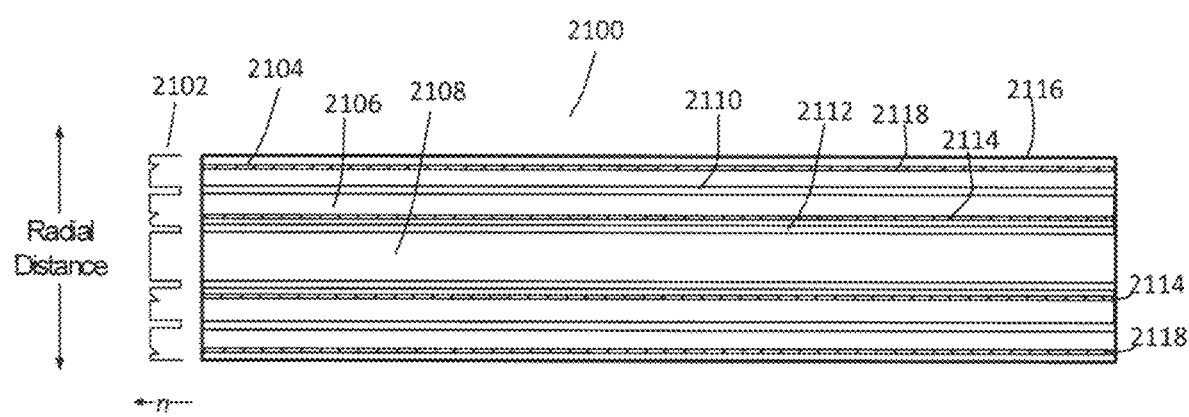

FIG. 21 depicts a cross-sectional view of an example second length of fiber 2100 having a RIP 2102 for modifying, maintaining, and/or confining beam characteristics adjusted in response to perturbation in the first length of fiber. Second length of fiber 2100 forms a portion of a VBC fiber assembly for delivering a beam having variable characteristics. In this example, there are three confinement regions 2104, 2106, and 2108 and three barrier layers 2110, 2112, and 2116. Second length of fiber 2100 also has a plurality of divergence structures 2114 and 2118. The divergence structures 2114 and 2118 are areas of graded lower index material. As the beam is launched from the first length fiber into second length of fiber 2100, refraction from divergence structures 2114 and 2118 causes the beam divergence to increase. The amount of increased divergence depends on the amount of spatial overlap of the beam with the divergence structure and the magnitude of the index difference between the divergence structure 2114 and/or 2118 and the surrounding core material of confinement regions 2106 and 2104 respectively. By adjusting the radial position of the beam near the launch point into the second length of fiber 2100, the divergence distribution may be varied. The design shown in FIG. 21 allows the intensity distribution and the divergence distribution to be varied somewhat independently by selecting both a particular confinement region and the divergence distribution within that conferment region (because each confinement region may include a divergence structure). The adjusted divergence of the beam is conserved in fiber 2100, which is configured to deliver the adjusted beam to the process head, another optical system, or the work piece. Forming the divergence structures 2114 and 2118 with a graded or non-constant index enables tuning of the divergence profile of the beam propagating in fiber 2100. An adjusted beam characteristic such as a radiance profile and/or divergence profile may be conserved as it is delivered to a process head by the second fiber. Alternatively, an adjusted beam characteristic such as a radiance profile and/or divergence profile may be conserved or further adjusted as it is routed by the second fiber through a fiber-to-fiber coupler (FFC) and/or fiber-to-fiber switch (FFS) and to a process fiber, which delivers the beam to the process head or the work piece.

Figure 26:
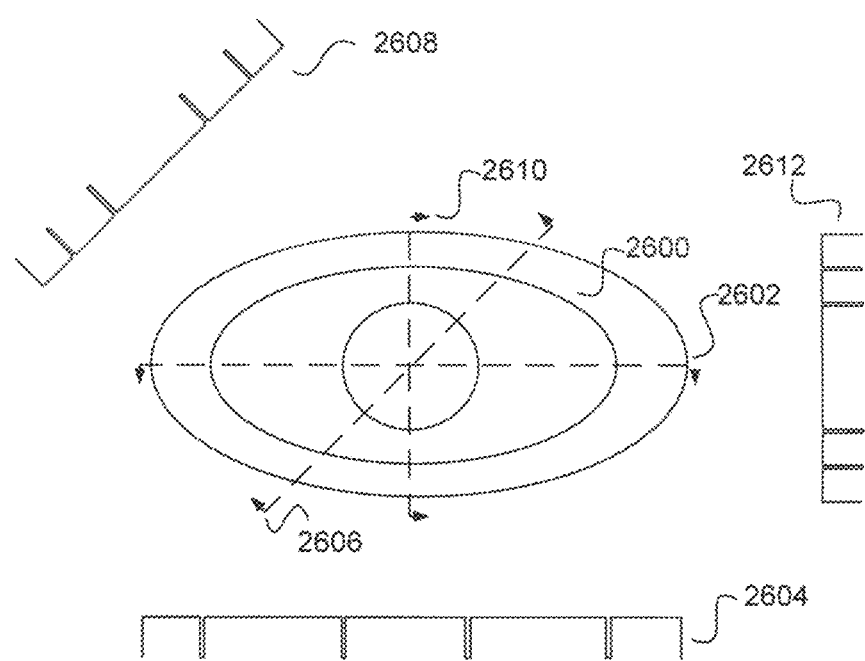
FIGS. 26-28 are cross-sectional views illustrating example second lengths of fiber ("confinement fibers") for confining adjusted beam characteristics in a fiber assembly.
Figure 27:
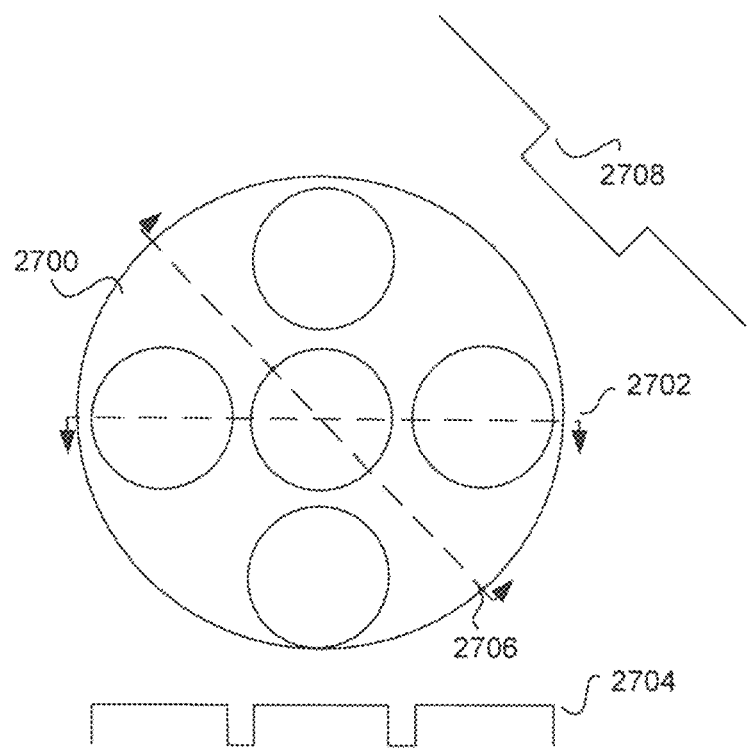
Figure 28:
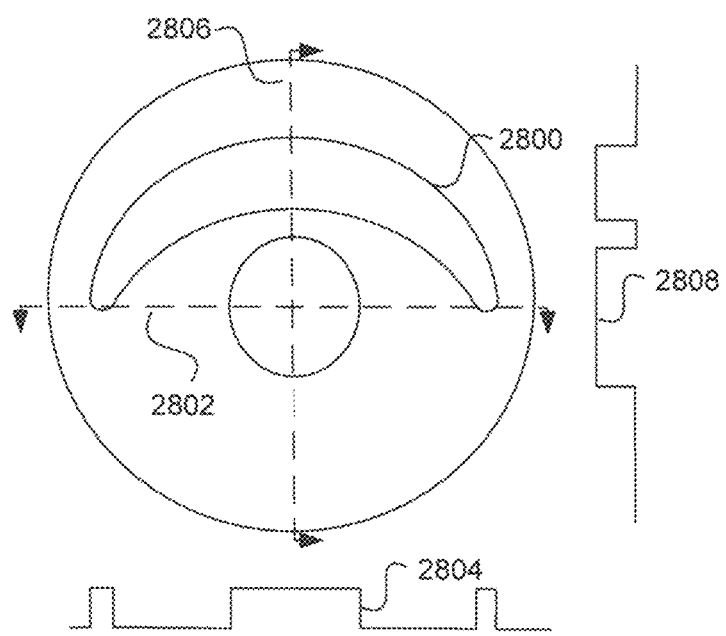

FIGS. 26-28 are cross-sectional views illustrating examples of fibers and fiber RIPs configured to enable maintenance and/or confinement of adjusted beam characteristics of a beam propagating in an azimuthally asymmetric second length of fiber wherein the beam characteristics are adjusted responsive to perturbation of a first length of fiber coupled to the second length of fiber and/or perturbation of the beam by a perturbation device 110. These azimuthally asymmetric designs are merely examples and are not an exhaustive recitation of the variety of fiber RIPs that may be used to enable maintenance and/or confinement of adjusted beam characteristics within an azimuthally asymmetric fiber. Thus, claimed subject matter is not limited to the examples provided herein. Moreover, any of a variety of first lengths of fiber (e.g., like those described above) may be combined with any azimuthally asymmetric second length of fiber (e.g., like those described in FIGS. 26-28).

FIG. 26 illustrates RIPs at various azimuthal angles of a cross-section through an elliptical fiber 2600. At a first azimuthal angle 2602, fiber 2600 has a first RIP 2604. At a second azimuthal angle 2606 that is rotated 45° from first azimuthal angle 2602, fiber 2600 has a second RIP 2608. At a third azimuthal angle 2610 that is rotated another 45° from second azimuthal angle 2606, fiber 2600 has a third RIP 2612. First, second and third RIPs 2604, 2608 and 2612 are all different.

FIG. 27 illustrates RIPs at various azimuthal angles of a cross-section through a multicore fiber 2700. At a first azimuthal angle 2702, fiber 2700 has a first RIP 2704. At a second azimuthal angle 2706, fiber 2700 has a second RIP 2708. First and second RIPs 2704 and 2708 are different. In an example, perturbation device 110 may act in multiple planes in order to launch the adjusted beam into different regions of an azimuthally asymmetric second fiber.

FIG. 28 illustrates RIPs at various azimuthal angles of a cross-section through a fiber 2800 having at least one crescent shaped core. In some cases, the corners of the crescent may be rounded, flattened, or otherwise shaped, which may minimize optical loss. At a first azimuthal angle 2802, fiber 2800 has a first RIP 2804. At a second azimuthal angle 2806, fiber 2800 has a second RIP 2808. First and second RIPs 2804 and 2808 are different.

Figure 22A:
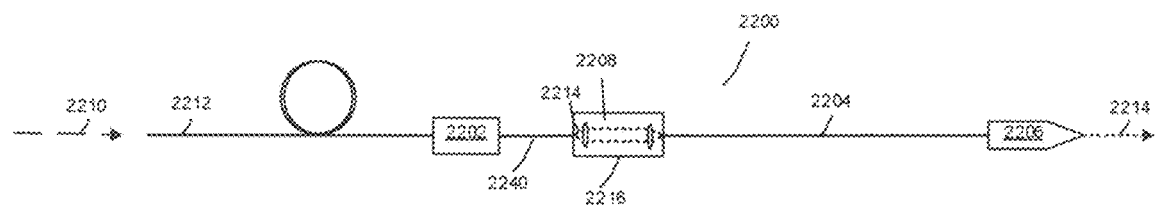
FIG. 22A illustrates an example laser system including a fiber assembly configured to provide variable beam characteristics disposed between a feeding fiber and process head.

FIG. 22A illustrates an example of a laser system 2200 including a VBC fiber assembly 2202 configured to provide variable beam characteristics. VBC fiber assembly 2202 comprises a first length of fiber 104, second length of fiber 108, and a perturbation device 110. VBC fiber assembly 2202 is disposed between feeding fiber 2212 (i.e., the output fiber from the laser source) and VBC delivery fiber 2240. VBC delivery fiber 2240 may comprise second length of fiber 108 or an extension of second length of fiber 108 that modifies, maintains, and/or confines adjusted beam characteristics. Beam 2210 is coupled into VBC fiber assembly 2202 via feeding fiber 2212. Fiber assembly 2202 is configured to vary the characteristics of beam 2210 in accordance with the various examples described above. The output of fiber assembly 2202 is adjusted beam 2214 which is coupled into VBC delivery fiber 2240. VBC delivery fiber 2240 delivers adjusted beam 2214 to free-space optics assembly 2208, which then couples beam 2214 into a process fiber 2204. Adjusted beam 2214 is then delivered to process head 2206 by process fiber 2204. The process head can include guided wave optics (such as fibers and fiber coupler), free space optics such as lenses, mirrors, optical filters, diffraction gratings), beam scan assemblies such as galvanometer scanners, polygonal mirror scanners, or other scanning systems that are used to shape the beam 2214 and deliver the shaped beam to a workpiece.

In laser system 2200, one or more of the free-space optics of assembly 2208 may be disposed in an FFC or other beam coupler 2216 to perform a variety of optical manipulations of an adjusted beam 2214 (represented in FIG. 22A with different dashing than beam 2210). For example, free-space optics assembly 2208 may preserve the adjusted beam characteristics of beam 2214. Process fiber 2204 may have the same RIP as VBC delivery fiber 2240. Thus, the adjusted beam characteristics of adjusted beam 2214 may be preserved all the way to process head 2206. Process fiber 2204 may comprise a RIP similar to any of the second lengths of fiber described above, including confinement regions.

Figure 22B:
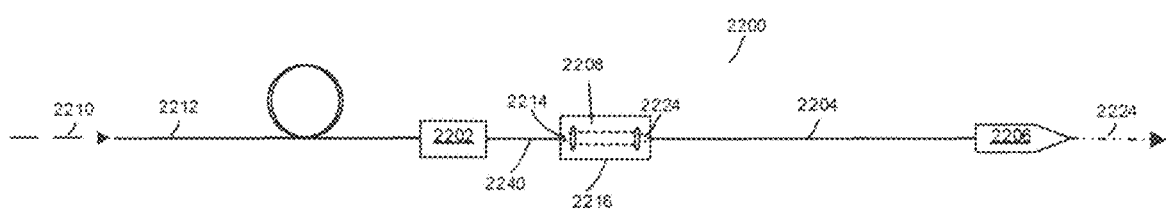
FIG. 22B illustrates an example laser system including a fiber assembly configured to provide variable beam characteristics disposed between a feeding fiber and process head.

Alternatively, as illustrated in FIG. 22B, free-space optics assembly 2208 may change the adjusted beam characteristics of beam 2214 by, for example, increasing or decreasing the divergence and/or the spot size of beam 2214 (e.g., by magnifying or demagnifying beam 2214) and/or otherwise further modifying adjusted beam 2214. Furthermore, process fiber 2204 may have a different RIP than VBC delivery fiber 2240. Accordingly, the RIP of process fiber 2204 may be selected to preserve additional adjustment of adjusted beam 2214 made by the free-space optics of assembly 2208 to generate a twice adjusted beam 2224 (represented in FIG. 22B with different dashing than beam 2214).

Figure 23:
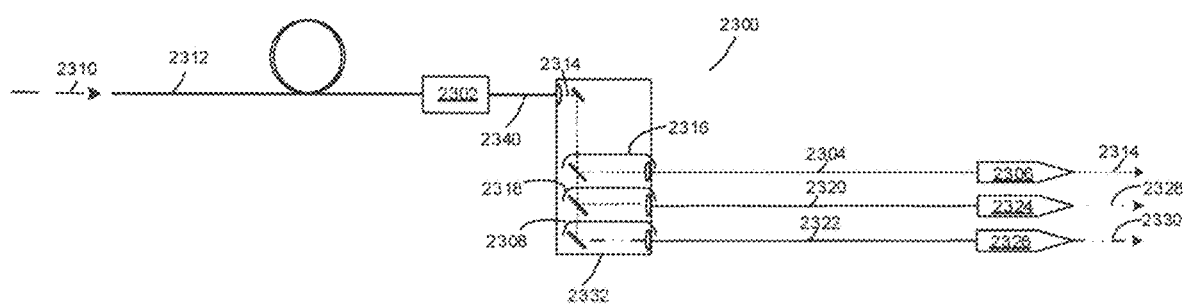
FIG. 23 illustrates an example laser system including a fiber assembly configured to provide variable beam characteristics disposed between a feeding fiber and multiple process fibers.

FIG. 23 illustrates an example of a laser system 2300 including VBC fiber assembly 2302 disposed between feeding fiber 2312 and VBC delivery fiber 2340. During operation, beam 2310 is coupled into VBC fiber assembly 2302 via feeding fiber 2312. Fiber assembly 2302 includes a first length of fiber 104, second length of fiber 108, and a perturbation device 110 and is configured to vary characteristics of beam 2310 in accordance with the various examples described above. Fiber assembly 2302 generates adjusted beam 2314 output by VBC delivery fiber 2340. VBC delivery fiber 2340 comprises a second length of fiber 108 of fiber for modifying, maintaining, and/or confining adjusted beam characteristics in a fiber assembly 2302 in accordance with the various examples described above (see FIGS. 17-21, for example). VBC delivery fiber 2340 couples adjusted beam 2314 into beam switch (FFS) 2332, which then couples its various output beams to one or more of multiple process fibers 2304, 2320, and 2322. Process fibers 2304, 2320, and 2322 deliver adjusted beams 2314, 2328, and 2330 to respective process heads 2306, 2324, and 2326.

In an example, beam switch 2332 includes one or more sets of free-space optics 2308, 2316, and 2318 configured to perform a variety of optical manipulations of adjusted beam 2314. Free-space optics 2308, 2316, and 2318 may preserve or vary adjusted beam characteristics of beam 2314. Thus, adjusted beam 2314 may be maintained by the free-space optics or adjusted further. Process fibers 2304, 2320, and 2322 may have the same or a different RIP as VBC delivery fiber 2340, depending on whether it is desirable to preserve or further modify a beam passing from the free-space optics assemblies 2308, 2316, and 2318 to respective process fibers 2304, 2320, and 2322. In other examples, one or more beam portions of beam 2310 are coupled to a workpiece without adjustment, or different beam portions are coupled to respective VBC fiber assemblies so that beam portions associated with a plurality of beam characteristics can be provided for simultaneous workpiece processing. Alternatively, beam 2310 can be switched to one or more of a set of VBC fiber assemblies.

Routing adjusted beam 2314 through any of free-space optics assemblies 2308, 2316, and 2318 enables delivery of a variety of additionally adjusted beams to process heads 2306, 2324, and 2326. Therefore, laser system 2300 provides additional degrees of freedom for varying the characteristics of a beam, as well as switching the beam between process heads ("time sharing") and/or delivering the beam to multiple process heads simultaneously ("power sharing").

For example, free-space optics in beam switch 2332 may direct adjusted beam 2314 to free-space optics assembly 2316 configured to preserve the adjusted characteristics of beam 2314. Process fiber 2304 may have the same RIP as VBC delivery fiber 2340. Thus, the beam delivered to process head 2306 will be a preserved adjusted beam 2314.

In another example, beam switch 2332 may direct adjusted beam 2314 to free-space optics assembly 2318 configured to preserve the adjusted characteristics of adjusted beam 2314. Process fiber 2320 may have a different RIP than VBC delivery fiber 2340 and may be configured with divergence altering structures as described with respect to FIGS. 20 and 21 to provide additional adjustments to the divergence distribution of beam 2314. Thus, the beam delivered to process head 2324 will be a twice adjusted beam 2328 having a different beam divergence profile than adjusted beam 2314.

Process fibers 2304, 2320, and/or 2322 may comprise a RIP similar to any of the second lengths of fiber described above, including confinement regions or a wide variety of other RIPs, and claimed subject matter is not limited in this regard.

In yet another example, free-space optics switch 2332 may direct adjusted beam 2314 to free-space optics assembly 2308 configured to change the beam characteristics of adjusted beam 2314. Process fiber 2322 may have a different RIP than VBC delivery fiber 2340 and may be configured to preserve (or alternatively further modify) the new further adjusted characteristics of beam 2314. Thus, the beam delivered to process head 2326 will be a twice adjusted beam 2330 having different beam characteristics (due to the adjusted divergence profile and/or intensity profile) than adjusted beam 2314.

In FIGS. 22A, 22B, and 23, the optics in the FFC or FFS may adjust the spatial profile and/or divergence profile by magnifying or demagnifying the beam 2214 before launching into the process fiber. They may also adjust the spatial profile and/or divergence profile via other optical transformations. They may also adjust the launch position into the process fiber. These methods may be used alone or in combination.

FIGS. 22A, 22B, and 23 merely provide examples of combinations of adjustments to beam characteristics using free-space optics and various combinations of fiber RIPs to preserve or modify adjusted beams 2214 and 2314. The examples provided above are not exhaustive and are meant for illustrative purposes only. Thus, claimed subject matter is not limited in this regard.

Figure 24:
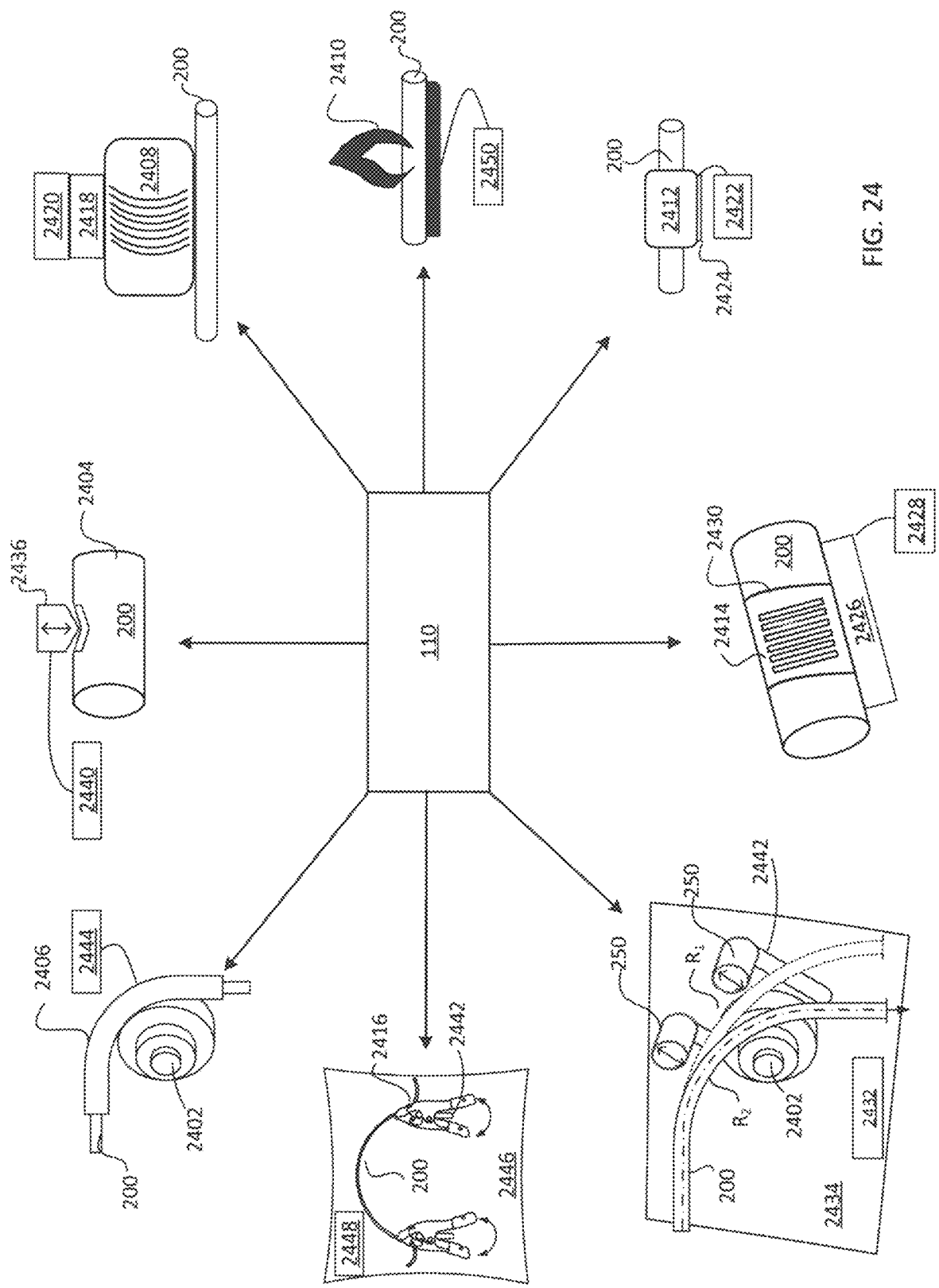
FIG. 24 illustrates examples of various perturbation assemblies for providing variable beam characteristics according to various examples provided herein.

FIG. 24 illustrates various examples of perturbation devices, assemblies or methods (for simplicity referred to collectively herein as "perturbation device 110") for perturbing a VBC fiber 200 and/or an optical beam propagating in VBC fiber 200 according to various examples provided herein. Perturbation device 110 may be any of a variety of devices, methods, and/or assemblies configured to enable adjustment of beam characteristics of a beam propagating in VBC fiber 200. In an example, perturbation device 110 may be a mandrel 2402, a micro-bend 2404 in the VBC fiber, flexible tubing 2406, an acousto-optic transducer 2408, a thermal device 2410, a piezo-electric device 2412, a grating 2414, a clamp 2416 (or other fastener), or the like, or any combination thereof. These are merely examples of perturbation devices 110 and not an exhaustive listing of perturbation devices 110 and claimed subject matter is not limited in this regard.

Mandrel 2402 may be used to perturb VBC fiber 200 by providing a form about which VBC fiber 200 may be bent. As discussed above, reducing the bend radius of VBC fiber 200 moves the intensity distribution of the beam radially outward. In some examples, mandrel 2402 may be stepped or conically shaped to provide discrete bend radii levels. Alternatively, mandrel 2402 may comprise a cone shape without steps to provide continuous bend radii for more granular control of the bend radius. The radius of curvature of mandrel 2402 may be constant (e.g., a cylindrical form) or non-constant (e.g., an oval-shaped form). Similarly, flexible tubing 2406, clamps 2416 (or other varieties of fasteners), or rollers 250 may be used to guide and control the bending of VBC fiber 200 about mandrel 2402. Furthermore, changing the length over which the fiber is bent at a particular bend radius also may modify the intensity distribution of the beam. VBC fiber 200 and mandrel 2402 may be configured to change the intensity distribution within the first fiber predictably (e.g., in proportion to the length over which the fiber is bent and/or the bend radius). Rollers 250 may move up and down along a track 2442 on platform 2434 to change the bend radius of VBC fiber 200.

Clamps 2416 (or other fasteners) may be used to guide and control the bending of VBC fiber 200 with or without a mandrel 2402. Clamps 2416 may move up and down along a track 2442 or platform 2446. Clamps 2416 may also swivel to change bend radius, tension, or direction of VBC fiber 200. Controller 2448 may control the movement of clamps 2416.

In another example, perturbation device 110 may be flexible tubing 2406 and may guide bending of VBC fiber 200 with or without a mandrel 2402. Flexible tubing 2406 may encase VBC fiber 200. Tubing 2406 may be made of a variety of materials and may be manipulated using piezo-electric transducers controlled by controller 2444. In another example, clamps or other fasteners may be used to move flexible tubing 2406.

Micro-bend 2404 in VBC fiber is a local perturbation caused by lateral mechanical stress on the fiber. Micro-bending can cause mode coupling and/or transitions from one confinement region to another confinement region within a fiber, resulting in varied beam characteristics of the beam propagating in a VBC fiber 200. Mechanical stress may be applied by an actuator 2436 that is controlled by controller 2440. However, this is merely an example of a method for inducing mechanical stress in fiber 200 and claimed subject matter is not limited in this regard.

Acousto-optic transducer (AOT) 2408 may be used to induce perturbation of a beam propagating in the VBC fiber using an acoustic wave. The perturbation is caused by the modification of the refractive index of the fiber by the oscillating mechanical pressure of an acoustic wave. The period and strength of the acoustic wave are related to the acoustic wave frequency and amplitude, allowing dynamic control of the acoustic perturbation. Thus, a perturbation device 110 including AOT 2408 may be configured to vary the beam characteristics of a beam propagating in the fiber. In an example, piezo-electric transducer 2418 may create the acoustic wave and may be controlled by controller or driver 2420. The acoustic wave induced in AOT 2408 may be modulated to change and/or control the beam characteristics of the optical beam in VBC 200 in real-time. However, this is merely an example of a method for creating and controlling an AOT 2408 and claimed subject matter is not limited in this regard.

Thermal device 2410 may be used to induce perturbation of a beam propagating in VBC fiber using heat. The perturbation is caused by the modification of the RIP of the fiber induced by heat. Perturbation may be dynamically controlled by controlling an amount of heat transferred to the fiber and the length over which the heat is applied. Thus, a perturbation device 110 including thermal device 2410 may be configured to vary a range of beam characteristics. Thermal device 2410 may be controlled by controller 2450.

Piezo-electric transducer 2412 may be used to induce perturbation of a beam propagating in a VBC fiber using piezoelectric action. The perturbation is caused by the modification of the RIP of the fiber induced by a piezoelectric material attached to the fiber. The piezoelectric material in the form of a jacket around the bare fiber may apply tension or compression to the fiber, modifying its refractive index via the resulting changes in density. Perturbation may be dynamically controlled by controlling a voltage to the piezo-electric device 2412. Thus, a perturbation device 110 including piezo-electric transducer 2412 may be configured to vary the beam characteristics over a particular range.

In an example, piezo-electric transducer 2412 may be configured to displace VBC fiber 200 in a variety of directions (e.g., axially, radially, and/or laterally) depending on a variety of factors, including how the piezo-electric transducer 2412 is attached to VBC fiber 200, the direction of the polarization of the piezo-electric materials, the applied voltage, etc. Additionally, bending of VBC fiber 200 is possible using the piezo-electric transducer 2412. For example, driving a length of piezo-electric material having multiple segments comprising opposing electrodes can cause a piezoelectric transducer 2412 to bend in a lateral direction. Voltage applied to piezoelectric transducer 2412 by electrode 2424 may be controlled by controller 2422 to control displacement of VBC fiber 200. Displacement may be modulated to change and/or control the beam characteristics of the optical beam in VBC 200 in real-time. However, this is merely an example of a method of controlling displacement of a VBC fiber 200 using a piezo-electric transducer 2412 and claimed subject matter is not limited in this regard.

Gratings 2414 may be used to induce perturbation of a beam propagating in a VBC fiber 200. A grating 2414 can be written into a fiber by inscribing a periodic variation of the refractive index into the core. Gratings 2414 such as fiber Bragg gratings can operate as optical filters or as reflectors. A long-period grating can induce transitions among co-propagating fiber modes. The radiance, intensity profile, and/or divergence profile of a beam comprised of one or more modes can thus be adjusted using a long-period grating to couple one or more of the original modes to one or more different modes having different radiance and/or divergence profiles. Adjustment is achieved by varying the periodicity or amplitude of the refractive index grating. Methods such as varying the temperature, bend radius, and/or length (e.g., stretching) of the fiber Bragg grating can be used for such adjustment. VBC fiber 200 having gratings 2414 may be coupled to stage 2426. Stage 2426 may be configured to execute any of a variety of functions and may be controlled by controller 2428. For example, stage 2426 may be coupled to VBC fiber 200 with fasteners 2430 and may be configured to stretch and/or bend VBC fiber 200 using fasteners 2430 for leverage. Stage 2426 may have an embedded thermal device and may change the temperature of VBC fiber 200.

Figure 25:
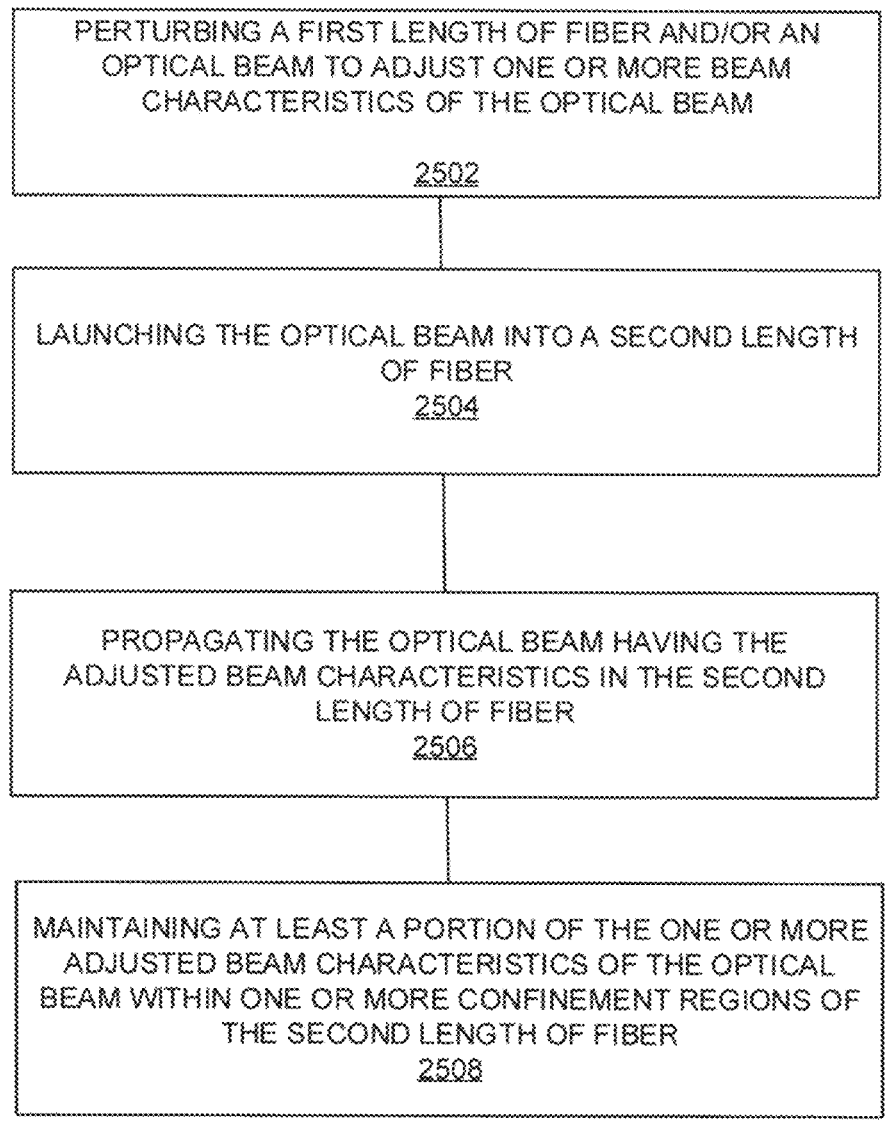
FIG. 25 illustrates an example process for adjusting and maintaining modified characteristics of an optical beam.

FIG. 25 illustrates an example process 2500 for adjusting and/or maintaining beam characteristics within a fiber without the use of free-space optics to adjust the beam characteristics. In block 2502, a first length of fiber and/or an optical beam are perturbed to adjust one or more optical beam characteristics. Process 2500 moves to block 2504, where the optical beam is launched into a second length of fiber. Process 2500 moves to block 2506, where the optical beam having the adjusted beam characteristics is propagated in the second length of fiber. Process 2500 moves to block 2508, where at least a portion of the one or more beam characteristics of the optical beam are maintained within one or more confinement regions of the second length of fiber. The first and second lengths of fiber may be comprised of the same fiber, or they may be different fibers.

Conventional laser-melting methods may suffer from detrimental effects caused to a target material. However, according to various methods described herein, it is possible to mitigate such effects and improve the quality or performance of the final article by controlling a melt pool (herein also referred to as "weld pool") formed by the melting of target material with an optical beam during laser processing, and/or controlling the subsequent re-solidification of the material. Such controlling of the melt pool can be achieved via closed-loop control comprising real-time monitoring of melt pool properties (e.g., sensing of signatures representative of the melt pool properties) and the automated adjustment of one or more beam characteristics, if necessary, to maintain and or change at least one property of the melt pool and/or re-solidification of the material in order to maintain or change at least one material property of the material exposed to the optical beam.

Figure 29A:
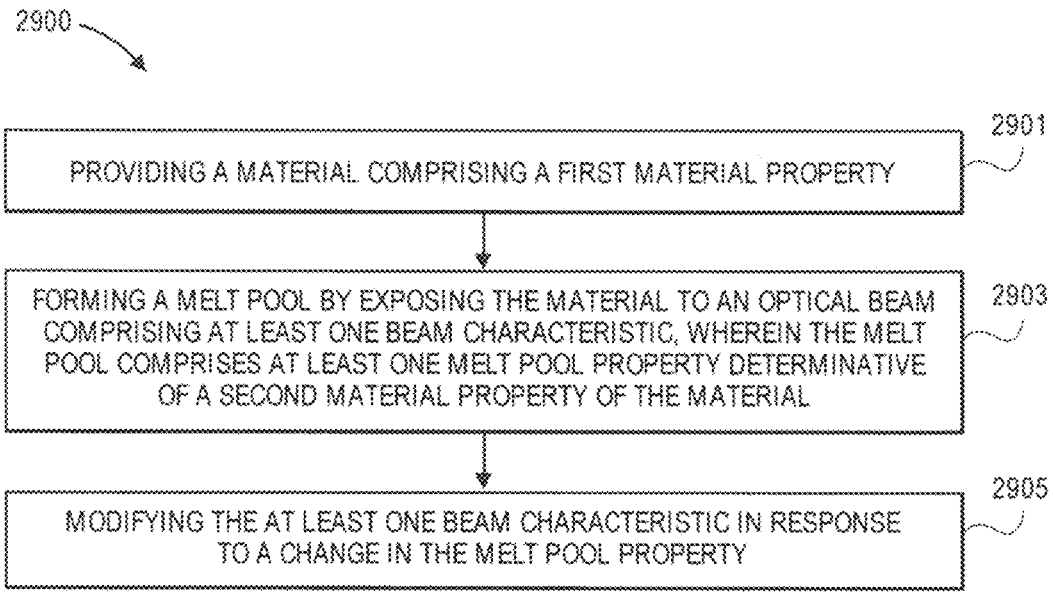
FIGS. 29A-29D are flow charts illustrating methods of utilizing optical beams according to various examples provided herein.

An embodiment of the present disclosure is directed to a method for forming an article, for example, a laser-melting method. In an implementation of such a method as that illustrated by flowchart 2900 in FIG. 29A, the method includes providing a material comprising a first material property at block 2901 and forming a melt pool by exposing the material to an optical beam comprising at least one beam characteristic at block 2903. Here, the melt pool may comprise at least one melt pool property. The at least one melt pool property may be determinative of a second material property, for example, upon re-solidification of the melt-pool material. The method also includes modifying the at least one beam characteristic in response to a change in the at least one melt pool property at block 2905.

Figure 29B:
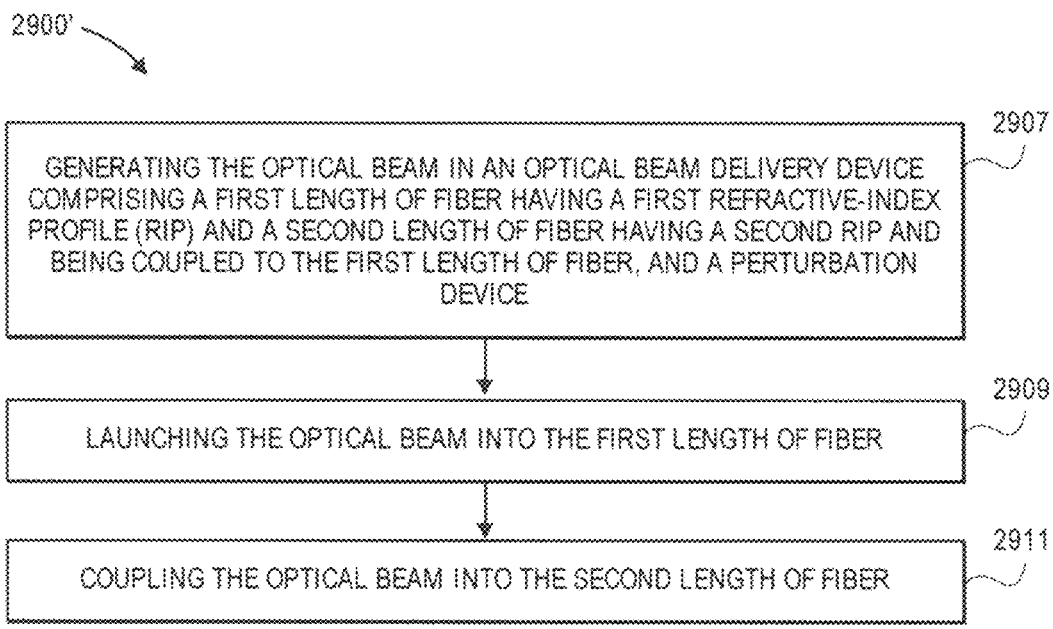

In an implementation, for example, as illustrated by flowcharts 2900' in FIG. 29B, a method of forming an article may further comprise generating the optical beam in an optical beam delivery device at block 2907 and launching the optical beam into a first length of fiber at block 2909. Here the optical beam delivery device comprises a first length of fiber having a first refractive-index profile (RIP) and a second length of fiber having a second RIP and being coupled to the first length of fiber, and a perturbation device as disclosed above. For example, the perturbation device may comprise a bending assembly configured to alter a bend radius or alter a bend length of the first length of fiber or a combination thereof to modify the beam characteristics of the optical beam. In some examples, a perturbation assembly may comprise a bending assembly, a mandrel, micro-bend in the fiber, an acousto-optic transducer, a thermal device, a fiber stretcher, or a piezo-electric device, or any combination thereof. Accordingly, in one implementation, the optical beam delivery device comprises a first length of fiber having a first RIP and a second length of fiber having a second RIP and being coupled to the first length of fiber, and a perturbation device configured to alter a bend radius of the first length of fiber. The method may further comprise coupling the optical beam into the second length of fiber at block 2911.

Figure 29C:
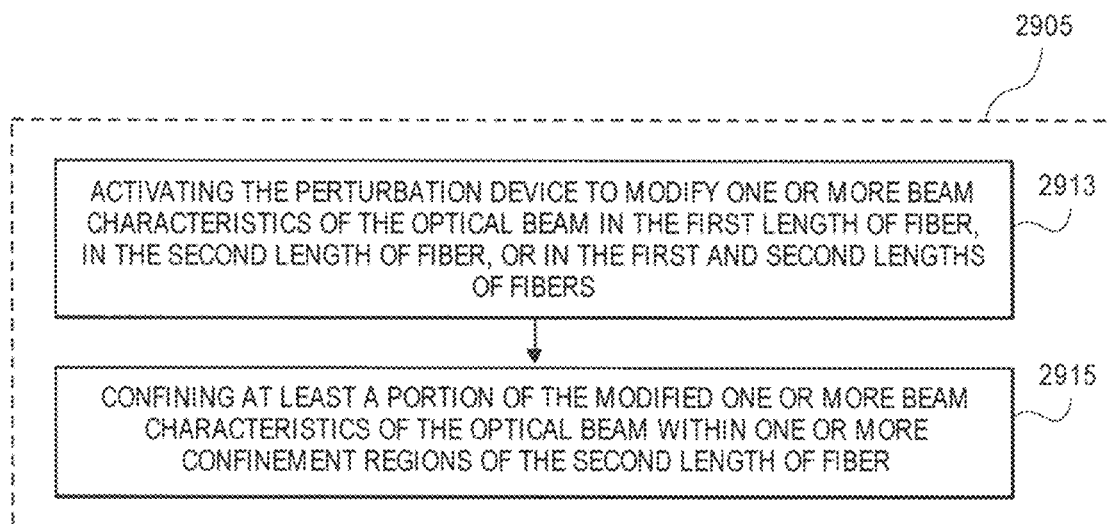

As illustrated in FIG. 29C, the modifying of the at least one beam characteristic of block 2905 may be performed by activating the perturbation device to modify one or more beam characteristics of the optical beam in the first length of fiber, in the second length of fiber, or in the first and second lengths of fibers (i.e., in one or more of the first length of fiber and the second length of fiber) at block 2913, and confining at least a portion of the modified one or more beam characteristics of the optical beam within one or more confinement regions of the second length of fiber at block 2915.

In this example, the characteristics of the optical beam can be modified using any of the above described techniques to provide an optical beam that is suitable for maintaining or changing the material property. The optical beam employed for exposing the material is emitted from an optical fiber, such as any of the optical fiber lasers disclosed herein. The one or more beam characteristics of the laser beam can be adjusted prior to or during the exposing of the material to the optical beam. As described herein, the adjusting of the optical beam occurs prior to the optical beam being emitted from the optical fiber, such as by perturbing a first fiber coupled to a second fiber, or by any of the other techniques set forth in the present disclosure. For example, adjusting the one or more beam characteristics can comprise adjusting one or more of a beam diameter, divergence distribution, beam parameter product (BPP), intensity distribution, luminance, M2 value, numerical aperture (NA), optical intensity, power density, radial beam position, radiance or spot size, or any combination thereof. In an embodiment, adjusting the one or more beam characteristics is carried out without the use of free-space optics, as also described herein.

In an example, adjusting the one or more beam characteristics comprises adjusting a beam parameter product of the optical beam. In yet another example, adjusting the one or more beam characteristics comprises adjusting a spot size, BPP, and/or divergence profile of the optical beam. Varying these beam characteristics can produce numerous different beam profiles suited for forming and controlling/adjusting the melt pool. The ability to control and/or adjust the melt pool can allow for controlling the materials properties.

In an example, the material may comprise a metal; a metal alloy; alloy systems including one or more of, but not limited to aluminum, nickel, cobalt, titanium, and iron, including those of steel (e.g., stainless steel such as SS 304) and brass; a polymer (e.g., thermoplastic); and any combination thereof. The material may be provided in the form of a bulk solid (e.g., a metal sheet or rod), as a plurality of solid particles (e.g., metal powder), as a combination of similar or dissimilar materials (e.g., a metal composite or other composite in which the matrix material and fillers and/or additives have different melting temperatures), or any combination thereof.

In an example, the at least one material property may comprise at least one bulk characteristic, at least one optical characteristic, at least one morphological characteristic, at least one compositional characteristic, or combinations thereof. The at least one bulk characteristic may comprise the form of the material including its volume, density, surface area, shape (e.g., cross-sectional shape), structure (e.g., whether crystal or amorphous) or any combination thereof. The at least one optical characteristic may comprise color, optical contrast (i.e., color difference), surface reflectivity, or a combination thereof. The at least one morphological characteristic may comprise structural features of a material, including its microstructure, nanostructure and crystal structure (e.g., crystal orientation), including features such as solidification direction, grain structure characteristic which may comprise least one of grain size and grain orientation; or a combination thereof. In the case of metals, such as alloy systems, including those of iron-carbon, the material property may include one or more the microstructures including spheroidite, pearlite, bainite, leduburite, and martensite. The at least one compositional characteristic can include the compositional makeup of the material which may be expressed as by its chemical formula, listing of its chemical constituents including the distribution thereof (e.g., vol. % and/or wt. %), or any combination thereof.

Figure 30:
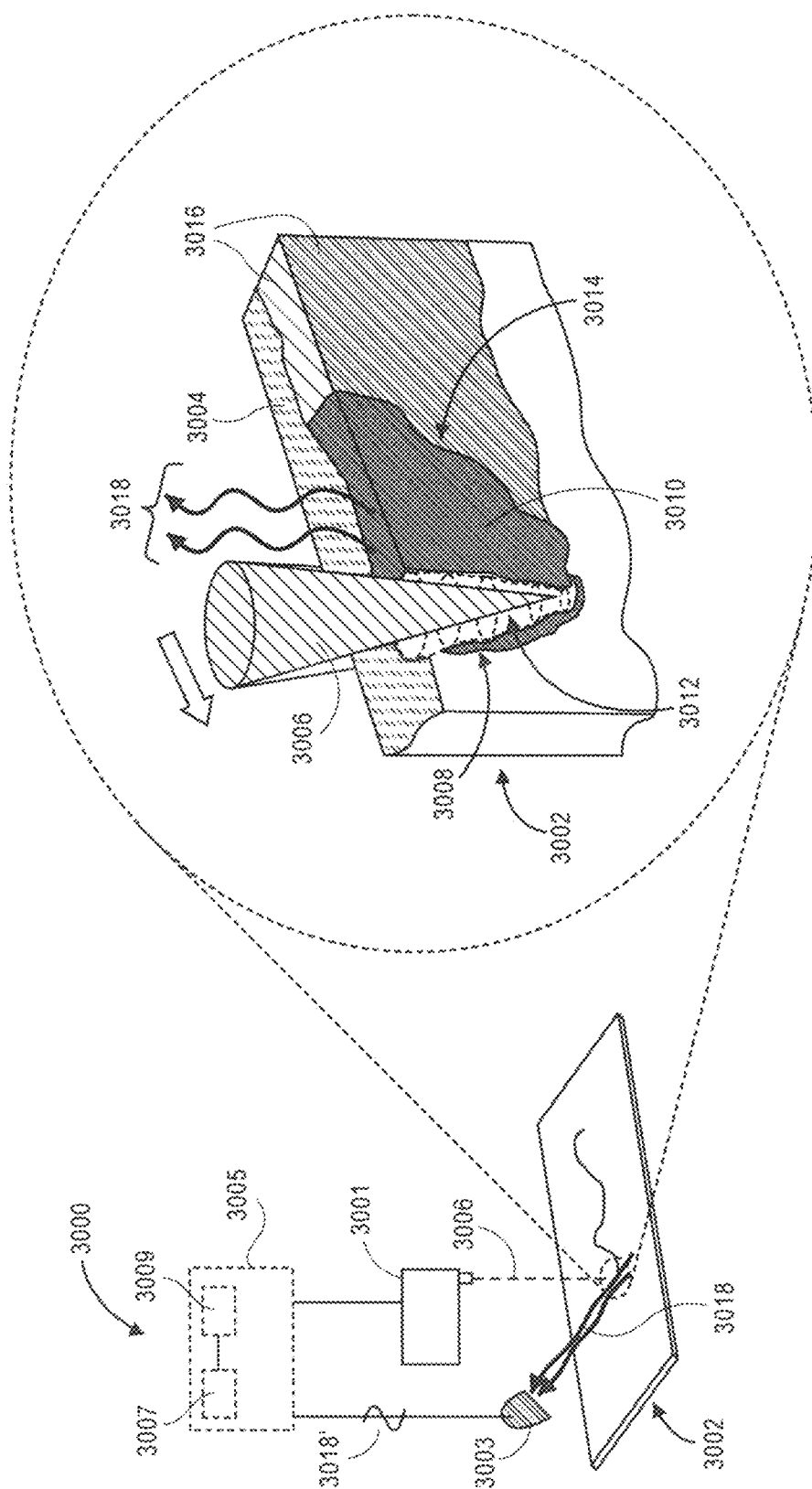
FIG. 30 illustrates an example laser system for controlling a melt pool according to various examples provided herein.

FIG. 30 shows a material 3002 having a first of a material property 3004 as it is exposed to optical beam 3006 generated by optical beam system 3000. The optical beam system 3000 comprises an optical beam delivery device 3001, a sensor 3003 that generates a signal in response to a signature 3018; and a feedback subsystem 3005 in communication with the optical beam delivery device 3001 and the sensor 3003. Here, the optical beam delivery device 3001 comprises a first length of fiber having a first refractive-index profile (RIP) and a second length of fiber having a second RIP and being coupled to the first length of fiber, and a perturbation device configured to alter a bend radius of the first length of fiber, not shown here but all as described above. The feedback subsystem 3005 comprises a memory 3007 configured to store data and/or instructions, and at least one processor 3009 configured to access the data and to execute instructions stored in the memory 3007.

The optical beam delivery device 3001 may direct optical beam 3006 to travel at a travel velocity (e.g., as indicated by the leftward facing arrow) and with at least one beam characteristic, for example at least one beam characteristic selected to induce melting of material 3002. As the optical beam 3006 travels according to the travel velocity and the at least one beam characteristic, at least portions of material 3002 melt, starting at a melting front 3008 which is located slightly adjacent to a front portion of the optical beam 3006, extending through a melt pool 3010 and terminating at a re-solidification front 3014 (where the melt pool begins cooling and the material re-solidifies). Portions of the melted material may vaporize leading to increased vapor pressure at the melt pool and the forming of a cavity 3012 within the melt pool. This cavity—also known as a keyhole cavity 3012 provides a path for the laser to penetrate deeper into the metal, thereby melting more material and which in turn provides energy to form a deeper keyhole in the material. This may be advantageous for certain processes, such as laser cutting. As the melt pool 3010 cools, the material 3002 re-solidifies at the re-solidification front 3014, and the material may comprise a second material property 3016.

In an example, the melt pool 3010 may be geometrically and volumetrically defined by the melting front 3008 and that of the re-solidification front 3014. The melt pool 3010 may comprise at least one keyhole cavity 3012. The melt pool 3010 may comprise at least one melt pool property. The at least one melt pool property may be any signature or trait of the melt pool, including any detectable or quantifiable property. The at least one melt pool property may be at least one thermodynamic characteristic, at least one electromagnetic characteristic, at least one optical characteristic, at least one bulk characteristic, or any combination thereof. The at least one thermodynamic characteristic may comprise a temperature of the melt pool, a temperature gradient through the melt pool, a temperature difference between two or more locations of the melt pool (e.g., a temperature of the melt pool adjacent to the melting front and a temperature adjacent to a re-solidification front). Additional thermodynamic characteristics include heat input and/or cooling rate of the melt pool. The at least one electromagnetic characteristic may comprise thermal radiation (e.g., incandescent light). The at least one optical characteristic may comprise optical transparency, surface reflectivity, or any combination thereof. The at least one bulk characteristic may comprise the form of the melt pool including its volume, its surface area, its shape/geometry (e.g., a cross-sectional shape and/or an aspect ratio), surface contour (i.e., the extent of the melt pool's liquid region as defined by edges of the melt pool), density, viscosity, or any combination thereof. The at least one melt pool property may be specified at any single instance thereof or according to a temporal evolution thereof (i.e., fluid dynamics).

In an example, the at least one keyhole cavity property may be any signature or trait of the keyhole cavity, including any detectable or quantifiable property. The at least one keyhole property may be at least one positional characteristic, at least one geometric characteristic, at least one optical characteristic, or any combination thereof of the keyhole cavity. The at least one positional characteristic may comprise a location in the melt pool relative to the melting front and/or the re-solidification front, for example, a distance from either or both. The at least one geometric characteristic may comprise a size of the keyhole cavity, including a its volume of the keyhole cavity, a depth of the keyhole cavity from a surface of the melt pool extending into the material, a diameter and/or surface area of the keyhole cavity's upper portion, and/or a shape of the keyhole cavity (e.g., a cross-sectional shape, a depth, and/or aspect ratio) including its inclination angle. The at least one optical characteristic may be a reflectivity of a sidewall of the keyhole cavity, for example, reflectivity for a range of wavelengths of electromagnetic energy that is provided to the keyhole cavity Continuing with FIG. 30, the at least one melt pool property may be determined in real-time. For example, one or more sensors 3003—each capable of sensing at least one melt pool signature indicative of the melt pool property— may be utilized for generating signals corresponding to the at least one melt pool property. Such signals can be communicated to the feedback subsystem to determine whether a change and/or a rate of change in the melt pool property is acceptable or unacceptable, for example, relative to known or stored information corresponding to melt pool properties, material properties and relationships between melt pool properties and the material properties. For example, for a given material, values corresponding to at least one melt pool property determinative of a second material property may be stored, such as in a look up table (e.g., in a database) for comparison with a signal corresponding to a real-time melt pool property.

In an implementation, the at least one melt pool property may comprise a signature 3018 corresponding to an attribute of the melt pool property. The signature 3018 may be sensed by sensor 3003. At least one property of the melt pool may be sensed by sensor 3003 via signature 3018. For example, in the case of an IR camera as the sensor 3003, the signature 3018 may be an infrared signature indicative of temperature of the melt pool. The signature 3018 may be measured according to a spectroscopic technique, for example, via plume monitoring (i.e., spectroscopic monitoring of vaporized metal particles measured as concentration intensities over given wavelength)

Alternatively, rather than or in addition to sensor 3003, the signature 3018 may be a process light that can be measured by the laser system. For example, in the case of a back reflection sensor as sensor 3003, the signature 3018 may comprise back-reflected laser light. In an example, the back reflection sensor may be incorporated in-line with the laser processing head or off-axis from with the laser processing head of an optical beam system.

At least one sensor 3003 generates at least one signal 3018' which can be communicated to feedback subsystem 3005. Processor 3009 can execute instructions (e.g., computer software) to correlate the at least one signal 3018' to a comparable value representative of the melt pool property. The comparable value may then be compared to stored values, such as from a library of values stored in a lookup table (e.g., a database) which may be stored in memory 3007 wherein the stored values correspond to predetermined, empirical or modeled at least one property of the melt pool related to a property of a material when it cools and re-solidifies from such a melt pool. In order to form a material having a second material property, the particular signature(s) of the melt pool that are determinative of forming such a second material property must be maintained. Accordingly, from time-to-time, feedback loop 3005 may determine that a real-time sensed signature has remained unchanged or deviated from the predetermined/ known/stored signature (within a particular range of tolerance(s)), in which case feedback subsystem 3005 may generate a signal which is communicated to optical beam delivery device 3001 as an instruction to adjust the one or more beam characteristics. In other words, the instructions can include retrieve a stored value from the data stored by the memory, the stored value corresponding to a known property of a melt pool; convert the signal generated by the sensor to a signature value corresponding to the melt pool property; calculate a difference between the stored value and the signature value; and modifying of the at least one beam characteristic when the difference is greater than a predetermined threshold value, for example, according to methods described herein.

Modifying the at least one beam characteristic may result in a change to at least one of a key hole in the melt, transverse or longitudinal thermal gradient of the melt, and/or a change in the melt pool shape. In an implementation, therefore, adjusting the characteristics of the optical beam comprises adjusting one or more of a beam diameter, divergence distribution, beam parameter product (BPP), intensity distribution, luminance, M2 value, numerical aperture (NA), optical intensity, power density, radial beam position, radiance or spot size, or any combination thereof. For example, a first set of optical beam characteristics, such as a first divergence distribution and/or intensity distribution, can be used to form a melt pool comprising a first melt pool property; and a second set of optical beam characteristics, such as a second divergence distribution and/or intensity distribution, can be used to form a melt pool comprising a second melt pool property, where the first set of laser beam characteristics is different from the second set of laser beam characteristics, and wherein the first melt pool property is different from the second melt pool property.

In an embodiment, the adjusting of the one or more beam characteristics of the laser beam prior to or during the exposing of the material comprises perturbing an optical beam propagating within a first length of fiber to adjust one or more of the beam characteristics of the laser beam in the first length of fiber or a second length of fiber or a combination thereof. As described herein, the perturbed optical beam is coupled into the second length of fiber. At least a portion of one or more adjusted beam characteristics is maintained within the second length of fiber. The first length of fiber and the second length of fiber have different refractive index profiles (RIPs). Accordingly, an instruction generated by feedback loop 3005 to adjust the one or more beam characteristic may comprise a signal that activates the perturbing of the optical beam.

The melt pool may be controlled by real-time updates of the at least one beam characteristic based, at least in part, on a property of the melt pool 3010 as sensed by sensor 3003. For example monitoring of the melt pool may comprise monitoring a property of the melt pool such as heat input, cooling rate or both, and/or incandescence thereof. Accordingly, system 3000 can control grain size of material 3002 such that a first grain size of the material (e.g., before melting with a laser) is different than a second grain size of the material (e.g., after resolidifying the material upon exposing it to the laser). Meanwhile, monitoring of the melt pool may comprise monitoring one or more morphological characteristics of the melt pool, including a weld aspect ratio. Accordingly, system 3000 can control the material's grain orientation such that a first grain orientation of the material (e.g., before melting with a laser) is different than a second grain size of the material (e.g., after resolidifying the material upon exposing it to the laser).

Changing the at least one beam characteristic may result in the ability to control and/or adjust the melt pool; i.e., at least one property of the melt pool. Meanwhile, the ability to control and/or adjust the melt pool provides for maintaining or changing material properties, for example, from a first of a material property to a second of a material property. That is, controlling of melt pool properties (or changes thereof) is determinative of controlling changes made to the material properties, for example, from a first material property to a second a material property.

It is noted that the modifying of the at least one beam characteristic may be performed continuously over a range of values. Alternatively, or in addition, the modifying of the at least one beam characteristic may be performed by oscillating over a plurality of discrete values, including a plurality of preset values (i.e., "presets"). For example, the at least one beam characteristic may be identified via empirically determined values which may be collected prior to the initiating of a manufacturing process or gathered in real-time during the manufacturing process. The at least one beam characteristic may be changed, if needed, between 2 or more presets, including 3 or more presets (i.e., selected by an operator using a computer-controlled interface). The at least one beam characteristic may be changed at a frequency of greater than about 0 Hz to about 10 kHz, including from greater than about 0 Hz to about 5 kHz, including in the range of from about greater than about 0 Hz to about 1 kHz or the range of from about 1 kHz to about 5 kHz.

Figure 29D:
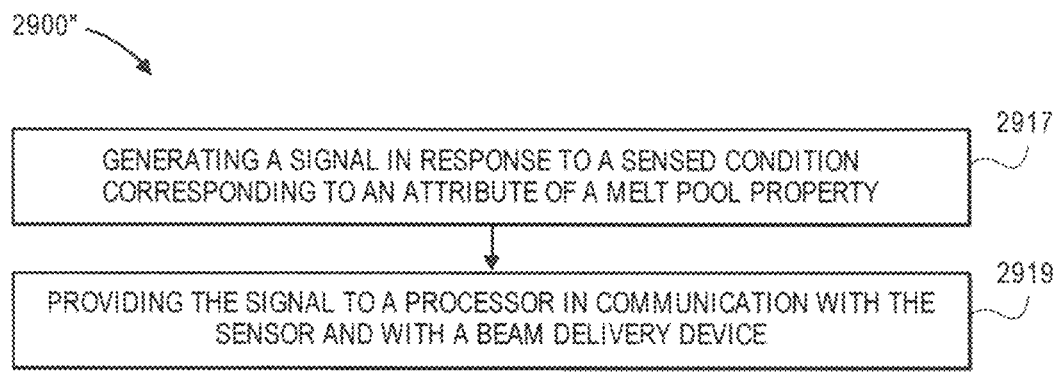

Illustrated by flowchart 2900" of FIG. 29D, the methods illustrated in flowcharts 2900, 2900' can, therefore, further include generating a signal in response to a sensed condition corresponding to an attribute of the melt pool at block 2917 (e.g., a signature 3018); and providing the signal (e.g., 3018') to a processor (e.g., 3009) in communication with both the sensor (e.g., 3003) and a beam delivery device (e.g., 3001) at block 2919.

In summary, a melt pool may be controlled by modifying the at least one beam characteristic such that the second material property resulting from resolidifying (e.g. subsequent to laser melting the material) is sufficiently different than a first material property. In an example, the first material property comprises a first grain structure and the second material property comprises a second grain structure. In an example the second grain structure comprises smaller equiaxed grain structures than in the first grain structure. In an example, the second grain structure is directionally solidified.

Any process described herein, including as represented in flowcharts 2900, 2900' and/or 2900", may be implemented according to an additive manufacturing process. An additive manufacturing system, such as additive manufacturing system 3100 illustrated in FIG. 31A, may be used for the implementation of an additive manufacturing process.

An additive manufacturing system 3100 includes optical beam delivery device 3001 having features as described above. Optical beam delivery device 3001 can be used in conjunction with or may incorporate a 3D print head 3101. The optical beam delivery device 3001 provides optical beam 3006 to a raw material feed stock 3020. The amount of raw material feedstock 3020 deposited to surface 3102 may be controlled by 3D print head 3101. Here, raw material feed stock 3020 is illustrated as solid particles, but other implementations are not so limited and the raw material feed stock may be in any suitable form. The raw material feed stock 3020 comprises a first material property 3004, for example, a material property as described above such as a first grain structure, including a solidification direction. As the feed stock 3020 is exposed to optical beam 3006, it can heat up and melt. A volume of melted feedstock forms a melt pool 3010.

In an example, the feed stock 3020 having a first of a material property 3004 may be deposited on a surface 3102 according to a predetermined pattern, exposed to the optical beam 3006, and melted to form the melt pool 3010 according to the predetermined pattern. In another example, the feed stock 3020 may be melted to form the melt pool 3010 first (i.e., before being deposited), for example, in a laser-melting chamber of the 3D print head 3101, and the melt pool 3010 can then be deposited by 3D print head 3101 in a predetermined pattern.

As illustrated in the inset of FIG. 31A, the melt pool 3010 cools, solidifies and forms as build layer 3122 having a second material property 3016. The heating, melting, forming of the melt pool, and cooling of the melt pool may be controlled, at least in part, by selection of at least one beam characteristic. Additionally, the depositing of the feed stock, the depositing of the melt pool such as in predetermined amounts, predetermined volume, predetermined shape, and/or a predetermined pattern may each also be controlled either independently from or in concert with selection of the at least one beam characteristic. Further, in additive manufacturing previously deposited material having material properties may be used as the feedstock material, re-melted and redeposited as described above such that its material properties remain the same or are different.

The melt pool cools and solidifies as build layer 3122 having a second material property 3016. 3D print head 3101 may perform several passes, having a same or different travel velocity for each pass, with a new build layer formed over a previous build layer in the same or in a different pass in order to form an article. Each subsequent build layer may comprise the same or a different material property as compared to a different portion of the same build layer, or as compared to any portion of a previous build layer.

Figure 32A:
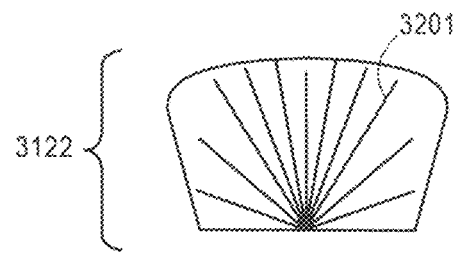
FIGS. 32A-32C illustrate examples of solidification control during layer stack up where the additive manufacturing system of FIG. 31A is used in setting and changing grain directionality during the forming of build layers.
Figure 32B:
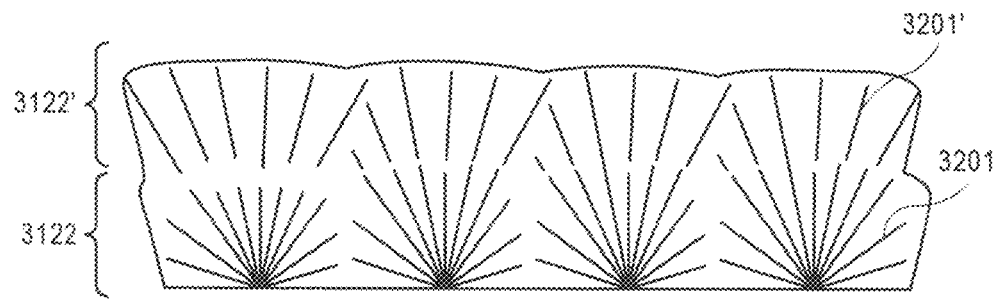
Figure 32C:
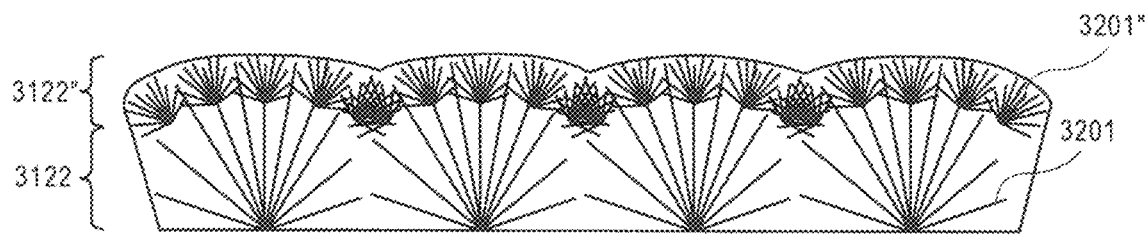

As described above, one or more additional build layers may be formed over a surface, such as over a previously formed build layer, according to the additive manufacturing process described above. An additive manufacturing system, such as additive manufacturing system 3100 illustrated in FIG. 31A, may be used for the implementation of such an additive manufacturing process. During such an additive manufacturing process, one or more beam characteristics may be controlled (i.e., maintained or adjusted) by the additive manufacturing system 3100 during the forming of one or more build layers to form an article. Accordingly, as illustrated in FIGS. 32A-32C, build layer(s) of the article may be formed to comprise the same or a different material property as that of another portion of the same build layer or as that of any portion of a different build layer. For example, illustrated in FIG. 32A is an additive spot such as at a cross-section of build layer 3122. Here, the material property comprises a solidification direction 3201. A second build layer 3122' may be formed according to an additive manufacturing process as implemented by, for example, additive manufacturing system 3100 over a previously formed build layer 3122 as illustrated in FIG. 32B. Here, one or more laser beam characteristics may need to be adjusted during the forming of the second build layer so that the solidification direction 3201' of a spot in second build layer 3122' may be the same as compared to that of another portion of the same second build layer 3122' or to be the same as solidification direction 3201 of an underlying spot of build layer 3122. Alternatively, a second build layer 3122" may be formed according to an additive manufacturing process as implemented by, for example, additive manufacturing system 3100 over a previously formed build layer as illustrated in FIG. 32C. Here, one or more laser beam characteristics may need to be adjusted during the forming of the second build layer so that the solidification direction 3201" of a spot in second build layer 3122" may be the same as compared to that of another portion of the same second build layer 3122" or to be the same different from the solidification direction 3201 of an underlying spot of build layer 3122. Whether or not the one or more beam characteristics must be adjusted will depend at least: 1) monitoring of a melt pool 3010 as a material (e.g., a raw material from a raw material feed) is melted by the optical beam during forming of a respective build layer as described above, and 2) real-time comparisons between values representative of melt pool signatures as sensed by a sensor and stored melt pool values as described above.

Examples of additive manufacturing processes that may benefit from the use of systems and methods described herein include directed energy deposition (DED) including laser energy directed deposition, powder fed, direct metal laser sintering (DMLS), laser powder bed, and the like.

Any process described herein, including as represented in flowcharts 2900, 2900' and/or 2900", may be implemented according to an additive manufacturing process. A laser-welding system, such as laser-welding system 3300 illustrated in FIG. 33A, may be used for the implementation of a laser-welding process.

A laser-manufacturing system 3300 includes optical beam delivery device 3001 having features as described above. Optical beam delivery device 3001 can be used in conjunction with or may incorporate a laser-welding head 3301. The optical beam delivery device 3001 provides optical beam 3006 to a raw material feed stock 3020. The amount of raw material feedstock 3020 deposited to surface 3102 may be controlled by the laser-welding head 3301. Here, raw material feed stock 3020 is illustrated as a solid wire, but other implementations are not so limited and the raw material feed stock may be in any suitable form. The raw material feed stock 3020 comprises a first material property 3004, for example, a material property as described above such as a first grain structure including a grain growth direction. As the feed stock 3020 is exposed to optical beam 3006, it can heat up and melt. A volume of melted feedstock forms a melt pool 3010.

In an example, the feed stock 3020 may be deposited so as to join (weld) surfaces 3302 and 3302' together, which may be according to a predetermined pattern. The feed stock 3020 is, therefore, exposed to the optical beam 3006, and melted to form the melt pool 3010. Some of the material in surfaces 3302 and 3302' may also melt and add to the melt pool.

Figure 33A:
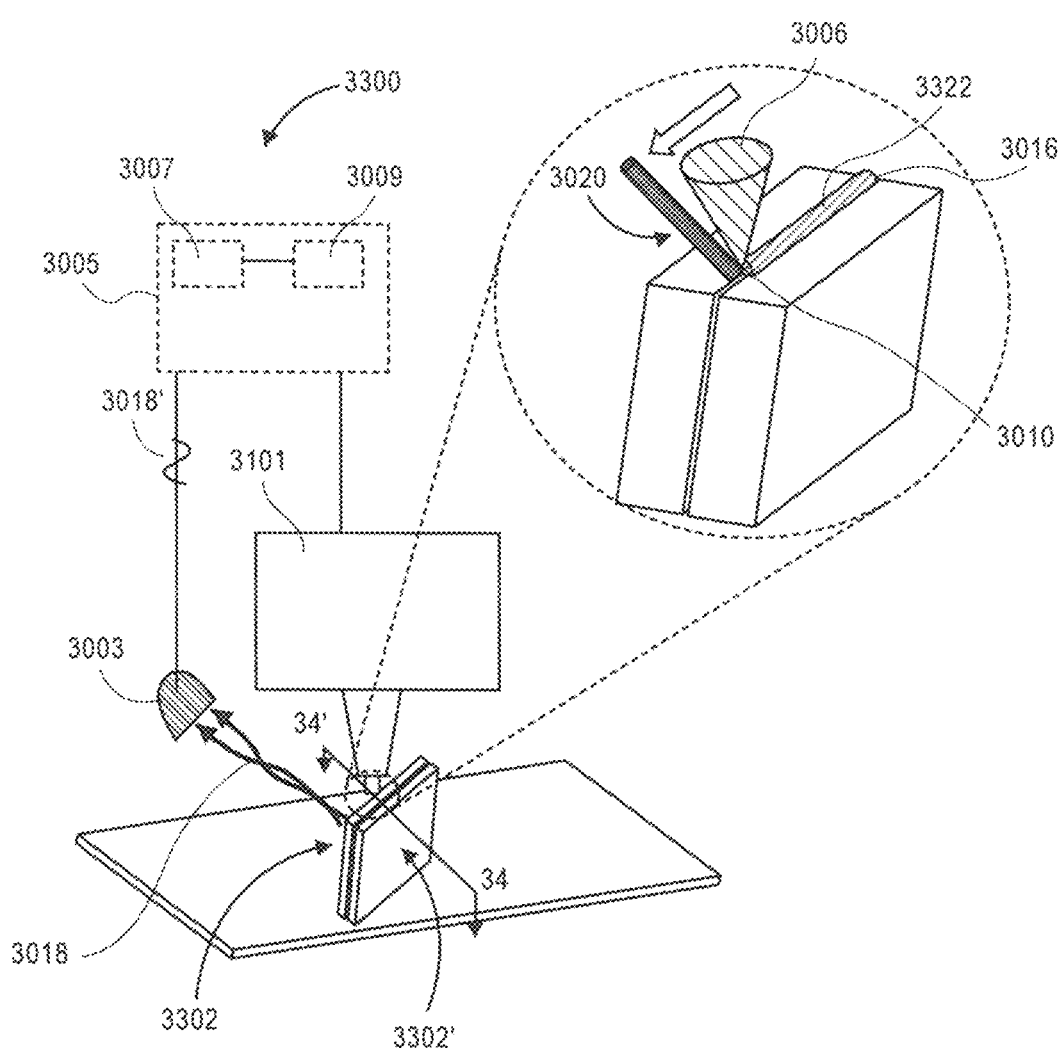
FIG. 33A illustrates an example laser-welding system that incorporates aspects of the laser system of FIG. 30.

As illustrated in the inset of FIG. 33A, the melt pool 3010 cools, solidifies and forms as weld 3322 having a second material property 3016. The heating, melting, forming of the melt pool, and cooling of the melt pool may be controlled, at least in part, by selection of at least one beam characteristic. Additionally, the forming of the melt pool such as in predetermined amounts, predetermined volume, predetermined shape, and/or a predetermined pattern may be controlled either independently from or in concert with selection of the at least one beam characteristic.

The melt pool cools and solidifies as weld 3322 having a second material property 3016. Laser-welding head 3301 may perform several passes over surfaces 3302 and/or 3302', having a same or different travel velocity for each pass, and may form a new weld over a previous weld in order to join two or more surfaces. Each subsequent weld may comprise the same or a different material property as compared to a different portion of the same weld, or as compared to any portion of a previously formed weld.

Figure 33B:
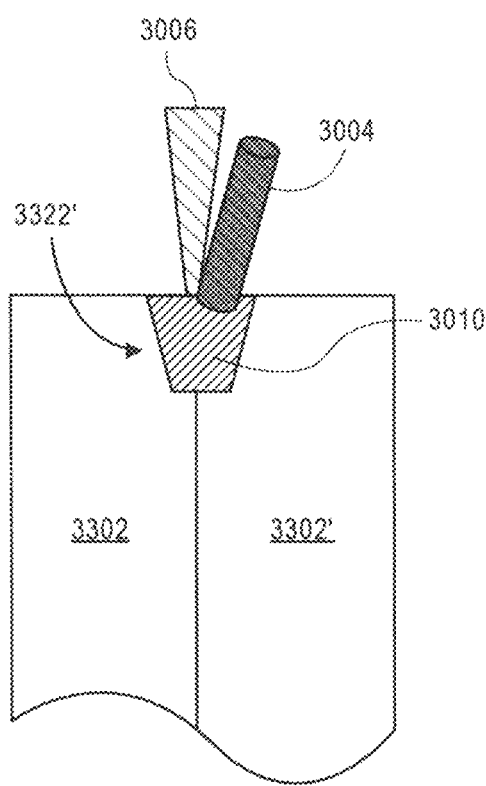
FIGS. 33B-33C are cross-sectional views of welds formed by the additive manufacturing system of FIG. 33A, with the weld of FIG. 33B having an aspect ratio of 1:1 and the weld of FIG. 33C having an aspect ratio of 10:1.
Figure 33C:
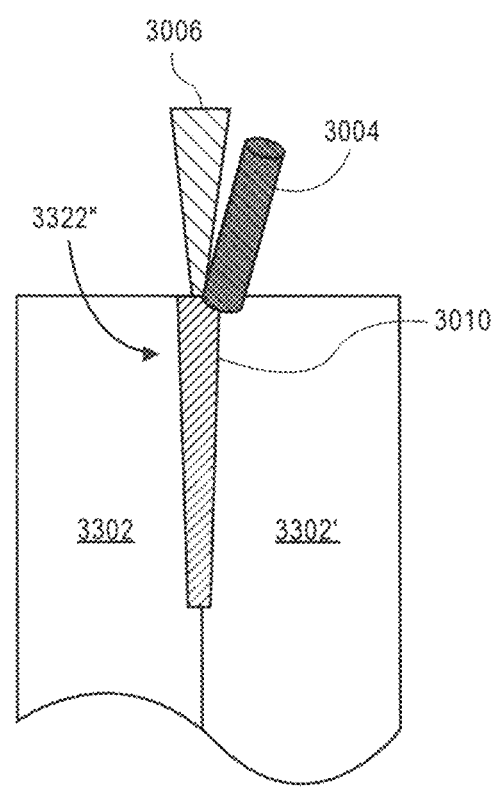

In an implementation, weld 3322' having an aspect ratio of 1:1 may be formed as illustrated in FIG. 33B. In ab implementation, weld 3322" having an aspect ratio of 10:1 may be formed.

Figure 34A:
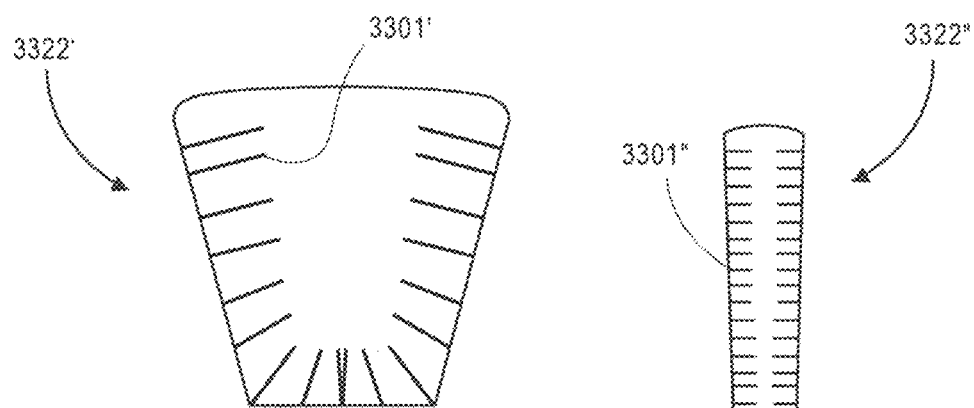
FIGS. 34A-34B are cross-sectional views showing grain growth direction in the welds of FIGS. 33C and 33D, respectively.
Figure 34B:
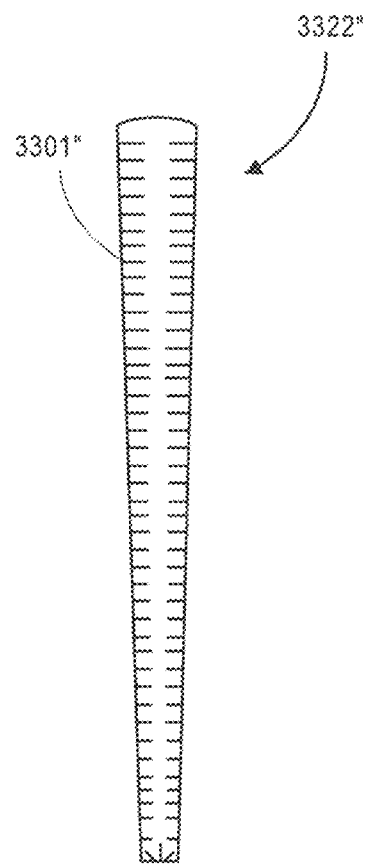

As described above, one or more additional welds may be formed to join multiple surfaces, such as a first surface and a second surface, according to the additive manufacturing process described above. A laser-welding system, such as laser-welding system 3300 illustrated in FIG. 33A, may be used for the implementation of such a laser-welding process. During such a laser-welding process, one or more beam characteristics may be controlled (i.e., maintained or adjusted) by the laser-welding system 3300 during the forming of one or more welds to join surfaces. As illustrated in FIGS. 34A-34B, welds may be formed to comprise the same or a different material property as that of another portion of the same weld. For example, illustrated in FIG. 34A is weld 3122' of FIG. 33B having an aspect ratio of 1:1. To form weld 3122', one or more beam characteristics of an optical beam may need to be adjusted so that the solidification direction 3301' of a spot may be the same or different as compared to that of another portion of the same weld 3322' or to be the same or different as a solidification direction at a spot of a different weld (not shown). Alternatively, a second weld 3322" having an aspect ratio of 10:1 may be formed according to an additive manufacturing process as implemented by, for example, laser-welding system 3300. Here, too, one or more laser beam characteristics may need to be adjusted during the forming of the welds so that the solidification direction 3301" of a spot in second weld 3322" may be the same or different as compared to that of another portion of the second weld 3122" or to be the same as a solidification direction at a spot of a different weld (not shown). Whether or not the one or more beam characteristics must be adjusted will depend on at least: 1) monitoring of a melt pool 3010 as a material (e.g., a raw material from a raw material feed) is melted by the optical beam during forming of a respective weld as described above, and 2) real-time comparisons between values representative of melt pool signatures as sensed by a sensor and stored melt pool values as described above.

Examples of laser-weld manufacturing processes that may benefit from the use of systems and methods described herein include those capable of producing various kinds of welds via laser-melting, including butt joints, lap joints, filet joints, edge joint, bevel joints, and the like.

One advantage of employing the methods of the present disclosure is that a material's grain structure can be tailored in a nearly infinite variety of ways and/or may be produced in a relatively efficient manner by providing an optical beam to melt a material, monitoring or sensing characteristics of the melting process and adjusting beam characteristics as described herein.

Having described and illustrated the general and specific principles of examples of the presently disclosed technology, it should be apparent that the examples may be modified in arrangement and detail without departing from such principles. We claim all modifications and variation coming within the spirit and scope of the following claims.

We claim:

1. A method for forming an article using a laser beam, the method comprising:
providing a material comprising a first material property;
forming a melt pool by exposing the material to the laser beam, wherein the melt pool comprises at least one melt pool property determinative of a second material property of the material; and
modifying at least one beam characteristic of the laser beam in response to a change in the melt pool property, the modifying of the at least one beam characteristic of the laser beam including:
perturbing an optical beam propagating within a first section of fiber to adjust the at least one characteristic of the laser beam in the first section of fiber or a second section of fiber or a combination thereof;
coupling the perturbed optical beam into the second section of fiber; and
maintaining at least a portion of one or more adjusted beam characteristics within the second section of fiber having two or more confinement regions, wherein the first section of fiber and the second section of fiber form at least a portion of a continuous length of fiber.

2. The method of claim 1, wherein the first section of fiber and the second section of fiber have different refractive index profiles (RIPs).

3. The method of claim 1, wherein the modifying of the at least one beam characteristic of the laser beam occurs prior to or during the exposing of the material to the laser beam.

4. The method of claim 1, wherein the material comprises a raw material feed.

5. The method of claim 4, wherein the raw material feed comprises a plurality of solid particles.

6. The method of claim 1, wherein the material comprises a metal.

7. The method of claim 1, wherein the material property comprises grain size, grain orientation, solidification direction, or a combination thereof.

8. The method of claim 1, wherein the first material property is different than the second material property.

9. The method of claim 8, wherein the first material property comprises a first grain structure, and wherein the second material property comprises a second grain structure that is different than the first grain structure.

10. The method of claim 9, wherein the second grain structure comprises smaller equiaxed grain structures than in the first grain structure.

11. The method of claim 1, wherein the second material property comprises directional solidification of the material.

12. The method of claim 1, wherein the melt pool property comprises a melt pool cross-sectional area.

13. The method of claim 1, wherein the modifying of the at least one beam characteristic is performed continuously over a range of values.

14. The method of claim 1, wherein the modifying of the at least one beam characteristic is performed by oscillating between a plurality of discrete values.

15. The method of claim 1, wherein the at least one beam characteristic includes a beam parameter product (BPP).

16. The method of claim 1, wherein the melt pool property comprises incandescent light emitted by the material in response to the exposing to the laser beam.

17. The method of claim 16, further comprising providing the incandescent light to a sensor configured to generate a signal representative of a signature of the incandescent light.

18. The method of claim 17, further comprising providing the signal to a processor, wherein the processor is in communication with the sensor and with a beam delivery device, wherein the processor is configured to access a memory that stores data and instructions, and wherein the processor is configured to execute the instructions, wherein the instructions comprise:
retrieving a stored value from the data stored by the memory, the stored value corresponding to a known property of a melt pool;
converting the signal generated by the sensor to a signature value corresponding to the melt pool property;
calculating a difference between the stored value and the signature value; and
modifying the at least one beam characteristic when the difference is greater than a predetermined threshold value.

19. The method of claim 1, further comprising forming at least a portion of the melt pool as a build layer.

20. The method of claim 1, wherein the forming of the melt pool comprises a step in an additive manufacturing process.

21. The method of claim 1, further comprising forming of at least a portion of the melt pool as a weld.

22. The method of claim 1, wherein the forming of the melt pool comprises a step in a laser-welding process.

23. An optical beam system, comprising:
  an optical beam delivery device, including:
    one or more optical beam sources configured to generate one or more optical beams; and
    a perturbation device configured to modify one or more beam characteristics of the generated one or more optical beams in a first section of fiber, in a second section of fiber, or combinations thereof, the second section of fiber having two or more confinement regions;
    wherein the second section of fiber is configured to confine one or more portions of the modified one or more beam characteristics within the two or more confinement regions, and wherein the first section of fiber and the second section of fiber form at least a portion of a continuous length of fiber;
  a sensor that generates a signal in response to sensing a signature of a melt pool property; and
  a feedback subsystem in communication with the optical beam delivery device and the sensor, wherein the feedback subsystem comprises:
    at least one memory to store data and instructions; and
    at least one processor configured to receive the signal, access the at least one memory, and execute the instructions.

24. The optical beam system of claim 23, wherein the instructions comprise:
  retrieving a stored value from the memory, the stored value corresponding to a known property of a melt pool;
  converting the signal generated by the sensor to a signature value corresponding to the melt pool property;
  calculating a difference between the stored value and the signature value; and
  modifying the at least one beam characteristic using the optical beam delivery device when the difference is greater than a predetermined threshold value.

25. The system of claim 23, wherein the system comprises an additive manufacturing system.

26. The system of claim 23, wherein the system comprises a laser-welding system.

* * * * *